United States Patent
Park et al.

(10) Patent No.: US 10,317,798 B2
(45) Date of Patent: Jun. 11, 2019

(54) METHOD OF FORMING PATTERN OF SEMICONDUCTOR DEVICE

(71) Applicant: Samsung Electronics Co., Ltd., Suwon-si, Gyeonggi-do (KR)

(72) Inventors: Sang-oh Park, Hwaseong-si (KR); Sang-chul Shin, Yongin-si (KR); Chang-hwan Kim, Hwaseong-si (KR); Ji-young Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 103 days.

(21) Appl. No.: 15/407,628

(22) Filed: Jan. 17, 2017

(65) Prior Publication Data
US 2017/0345710 A1    Nov. 30, 2017

(30) Foreign Application Priority Data

May 25, 2016  (KR) ........................ 10-2016-0064239

(51) Int. Cl.
| | | |
|---|---|---|
| *G03F 7/20* | (2006.01) | |
| *G03F 7/095* | (2006.01) | |
| *G11C 7/06* | (2006.01) | |
| *G11C 8/08* | (2006.01) | |
| *H01L 21/027* | (2006.01) | |
| *H01L 21/768* | (2006.01) | |

(Continued)

(52) U.S. Cl.
CPC ............ *G03F 7/2022* (2013.01); *G03F 7/095* (2013.01); *G03F 7/2041* (2013.01); *G11C 7/06* (2013.01); *G11C 8/08* (2013.01); *H01L 21/0274* (2013.01); *H01L 21/76816* (2013.01); *H01L 21/76877* (2013.01); *H01L 23/528* (2013.01); *H01L 23/5226* (2013.01); *G03F 7/0035* (2013.01)

(58) Field of Classification Search
CPC .................................................... G03F 7/2022
See application file for complete search history.

(56) References Cited

U.S. PATENT DOCUMENTS

| | | | |
|---|---|---|---|
| 7,115,525 B2 | 10/2006 | Abatchev et al. | |
| 7,615,490 B2 | 11/2009 | Kim | |

(Continued)

FOREIGN PATENT DOCUMENTS

| | | |
|---|---|---|
| KR | 10-0942074 B1 | 2/2010 |
| KR | 10-1002456 B1 | 12/2010 |
| KR | 2013/0049510 A | 5/2013 |

*Primary Examiner* — Kathleen Duda
(74) *Attorney, Agent, or Firm* — Harness, Dickey & Pierce, P.L.C.

(57) ABSTRACT

A method of forming a pattern of a semiconductor device includes: forming a first mask pattern comprising first mask lines extending in a first direction in a cell region and second mask lines extending in the first direction in a first core region, the first mask pattern covering a second core region; forming, on the first mask pattern, a second mask pattern comprising third mask lines extending in a second direction in the cell region and fourth mask lines extending in the second direction in the second core region, the second mask pattern covering the first core region; and forming a third mask pattern by using the second mask pattern, the third mask pattern comprising island-type masks in the cell region, fifth mask lines extending in the first direction in the first core region, and sixth mask lines extending in the second direction in the second core region.

20 Claims, 27 Drawing Sheets

(51) Int. Cl.
    *H01L 23/522*     (2006.01)
    *H01L 23/528*     (2006.01)
    *G03F 7/00*     (2006.01)

(56) References Cited

U.S. PATENT DOCUMENTS

| | | |
|---|---|---|
| 8,133,818 B2 | 3/2012 | Jung |
| 8,389,400 B2 | 3/2013 | Lee et al. |
| 8,652,968 B2 | 2/2014 | Yu et al. |
| 8,835,314 B2 | 9/2014 | Kim |
| 2009/0001503 A1* | 1/2009 | Oh .................. H01L 27/1203 257/506 |
| 2013/0040452 A1* | 2/2013 | Park ................ H01L 21/0337 438/612 |
| 2014/0273287 A1 | 9/2014 | Park et al. |
| 2016/0020109 A1 | 1/2016 | Yoo |

* cited by examiner

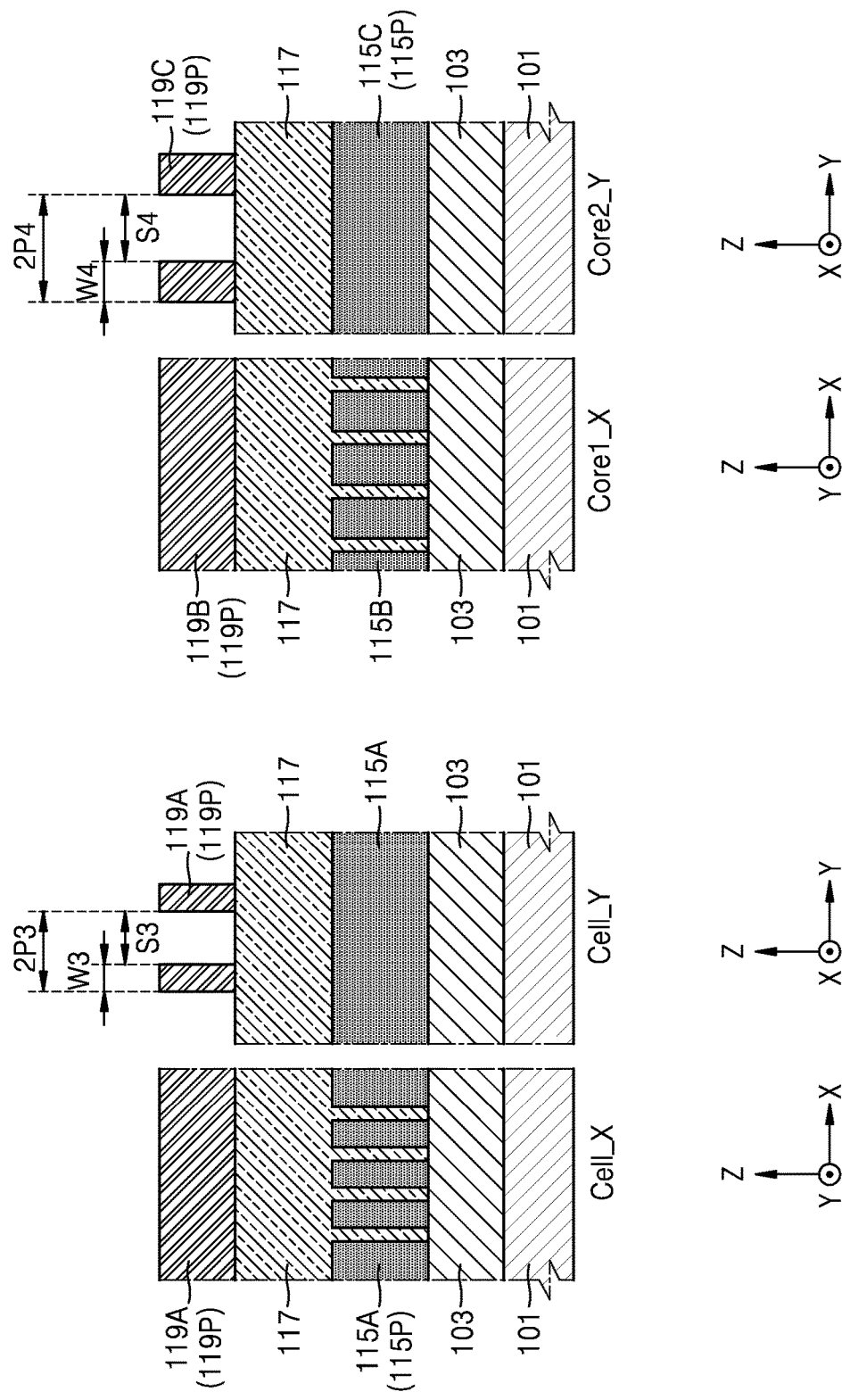

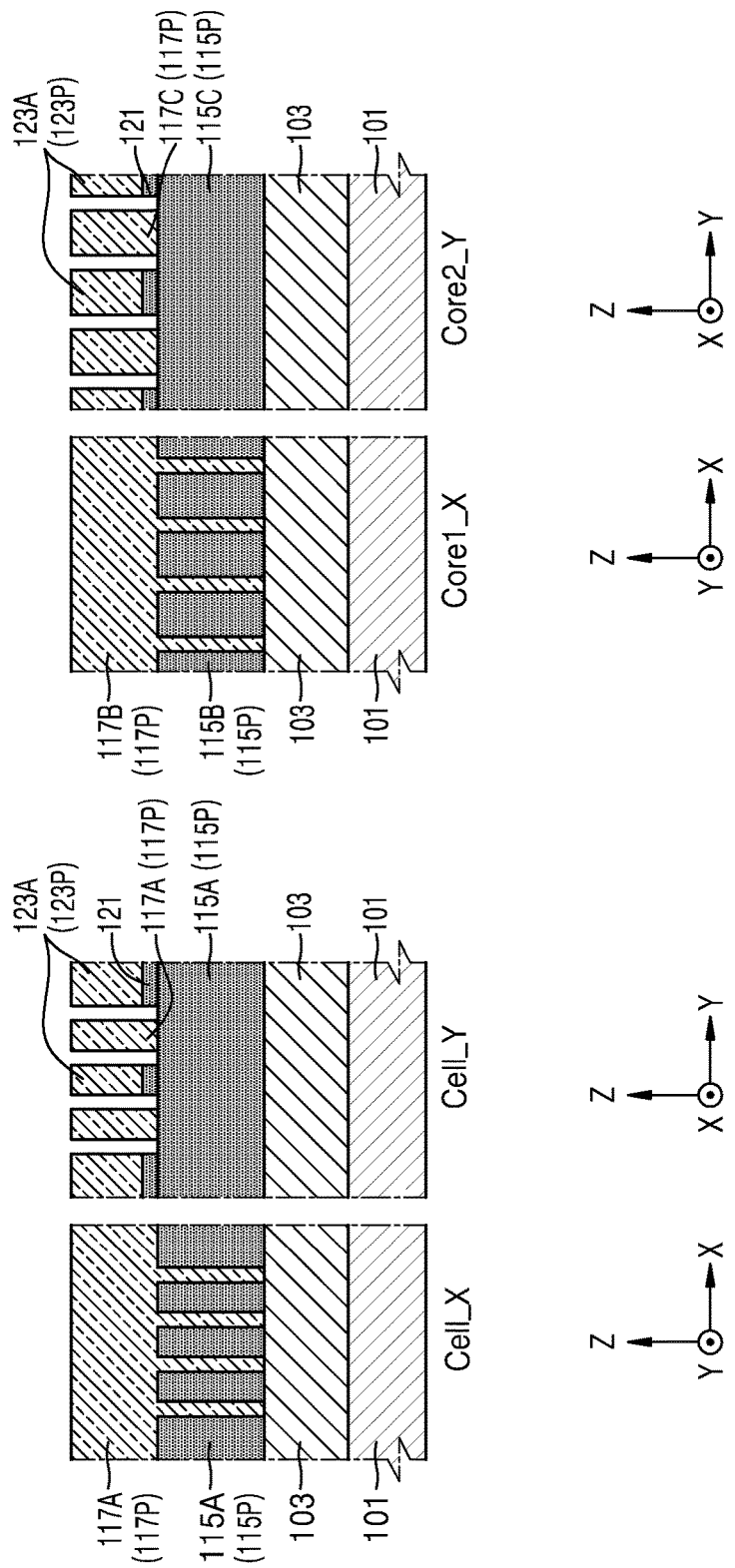

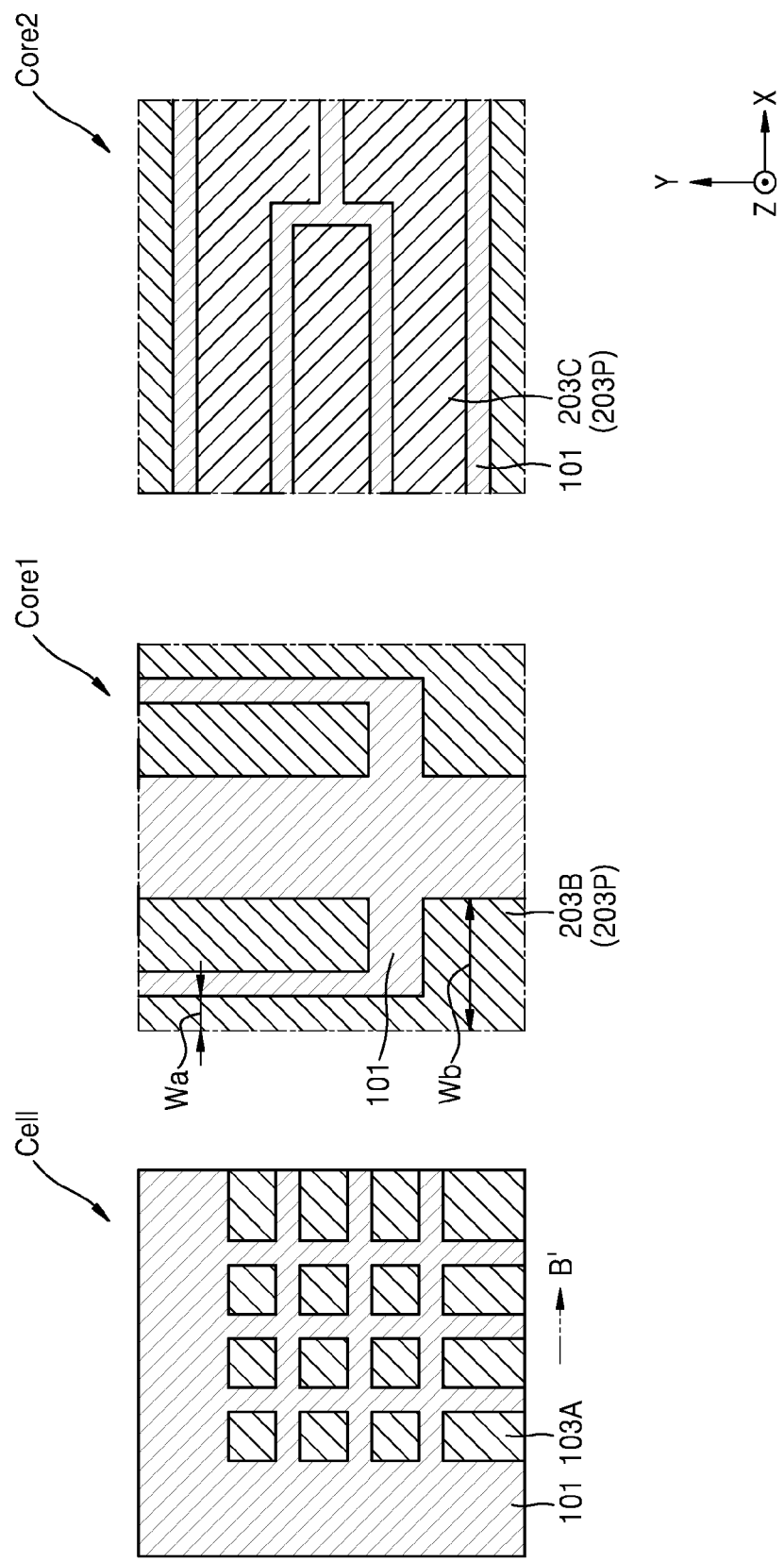

METHOD OF FORMING PATTERN OF SEMICONDUCTOR DEVICE

CROSS-REFERENCE TO RELATED APPLICATION

This application claims the benefit of Korean Patent Application No. 10-2016-0064239, filed on May 25, 2016, in the Korean Intellectual Property Office, the disclosure of which is incorporated herein in its entirety by reference.

BACKGROUND

The inventive concepts relate to a method of forming a pattern of a semiconductor device, and more particularly, to a method of forming a pattern of a semiconductor device, which may simplify a manufacturing process in addition to improving alignment margins.

As the integration degree of semiconductor devices has increased, pattern pitches have reached process limits. Accordingly, the patterning of a cell region is performed by using a plurality of exposure processes to solve limits of the exposure process and alignment margin problems.

Since patterns having narrow widths are advantageous in a core region, the number of exposure processes is increasing and manufacturing processes are becoming more complex. Thus, techniques of implementing narrow patterns in the core region, improving alignment margins, and simplifying a manufacturing process are currently being researched.

SUMMARY

The inventive concepts provide a method of forming a pattern of a semiconductor device, which may simplify a manufacturing process to reduce a manufacturing cost in addition to improving an alignment margin of core region patterns as patterns become smaller.

According to an aspect of the inventive concepts, there is provided a method of forming a pattern of a semiconductor device, the method including: forming a first mask pattern including a plurality of first mask lines extending substantially in a first direction in a cell region of a substrate and a plurality of second mask lines extending substantially in the first direction in a first core region of the substrate, the first mask pattern covering a second core region of the substrate; forming, on the first mask pattern, a second mask pattern including a plurality of third mask lines extending substantially in a second direction in the cell region and a plurality of fourth mask lines extending substantially in the second direction in the second core region, the second mask pattern covering the first core region; and forming a third mask pattern by etching the first mask pattern by using the second mask pattern as an etch mask, the third mask pattern including a plurality of island-type masks in the cell region, a plurality of fifth mask lines extending substantially in the first direction in the first core region, and a plurality of sixth mask lines extending substantially in the second direction in the second core region.

According to another aspect of the inventive concepts, there is provided a method of forming a pattern of a semiconductor device, the method including: forming a first mask pattern including a plurality of first mask lines extending substantially in a first direction in a cell region and a core region of a substrate; forming a second mask pattern on the first mask pattern, the second mask pattern including a plurality of second mask lines extending substantially in a second direction in the cell region and a plurality of third mask lines extending substantially in the second direction in the core region, wherein the plurality of second mask lines intersect the plurality of first mask lines; and forming a third mask pattern by etching the first mask pattern using the second mask pattern as an etch mask, the third mask pattern including a plurality of island-type first patterns in the cell region, a plurality of fourth mask lines extending substantially in the first direction in the core region, and a plurality of fifth mask lines extending substantially in the second direction in the core region.

According to another aspect of the inventive concepts, there is provided a method of forming a pattern including a plurality of regions of a semiconductor device, comprising: forming a first mask pattern, the first mask pattern including a first plurality of lines extending in a first direction in a first region of the semiconductor device, a second plurality of lines extending in the first direction in a second region of the semiconductor device, and a third plurality of lines extending in the first direction in a third region of the semiconductor device. The method further comprises forming a second mask pattern on the first mask pattern, the second mask pattern including; a fourth plurality of lines extending in a second direction in the first region of the semiconductor device, a fifth plurality of lines extending in the second direction in a fourth region of the semiconductor device, and a sixth plurality of lines extending substantially in the second direction in the third region of the semiconductor device. The method further comprises forming a third mask pattern by etching the first mask pattern using the second mask pattern as an etch mask.

BRIEF DESCRIPTION OF THE DRAWINGS

Example embodiments of the inventive concepts will be more clearly understood from the following detailed description taken in conjunction with the accompanying drawings in which:

FIGS. 3 to 14C are cross-sectional views and plan views for describing, according to a process sequence, a method of forming a pattern of a semiconductor device, according to an example embodiment;

DETAILED DESCRIPTION

Figure 1:
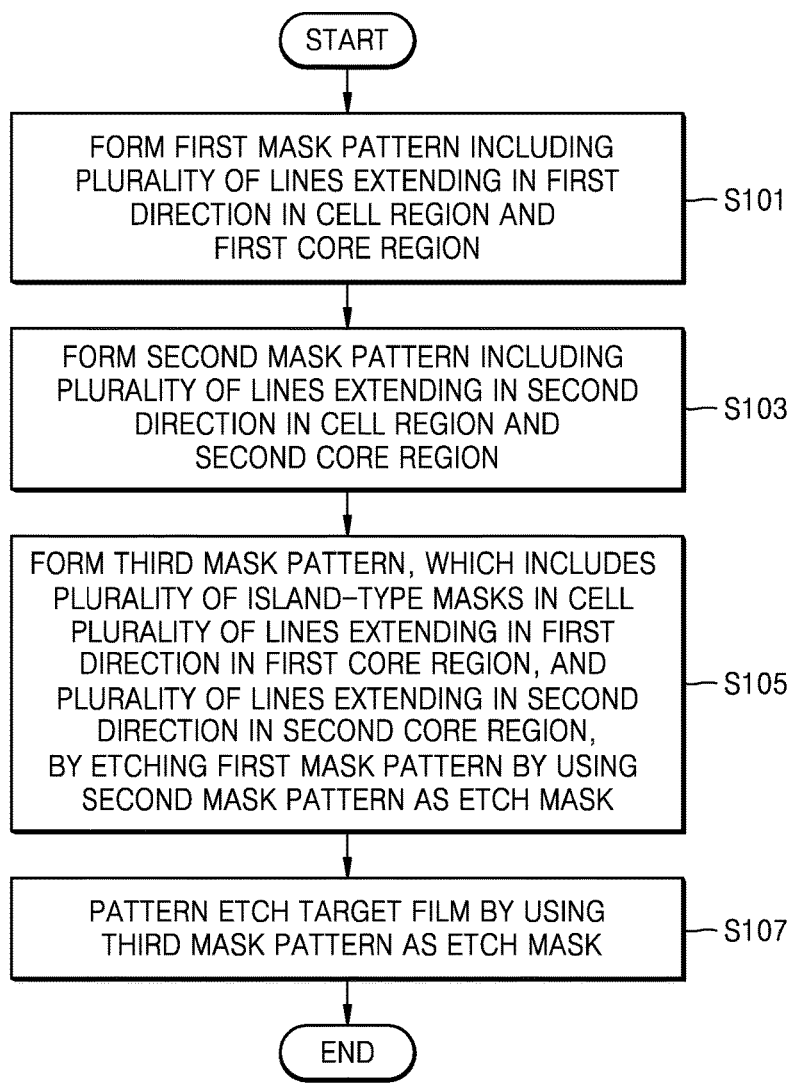
FIG. 1 is a flowchart of a method of forming a pattern of a semiconductor device, according to an example embodiment.

The inventive concepts will now be described more fully hereinafter with reference to the accompanying drawings, in which example embodiments of the inventive concepts are shown. Like reference numerals denote like elements in the drawings, and repeated descriptions for like elements are omitted.

FIG. 1 is a flowchart of a method of forming a pattern of a semiconductor device, according to an example embodiment.

Figure 2:
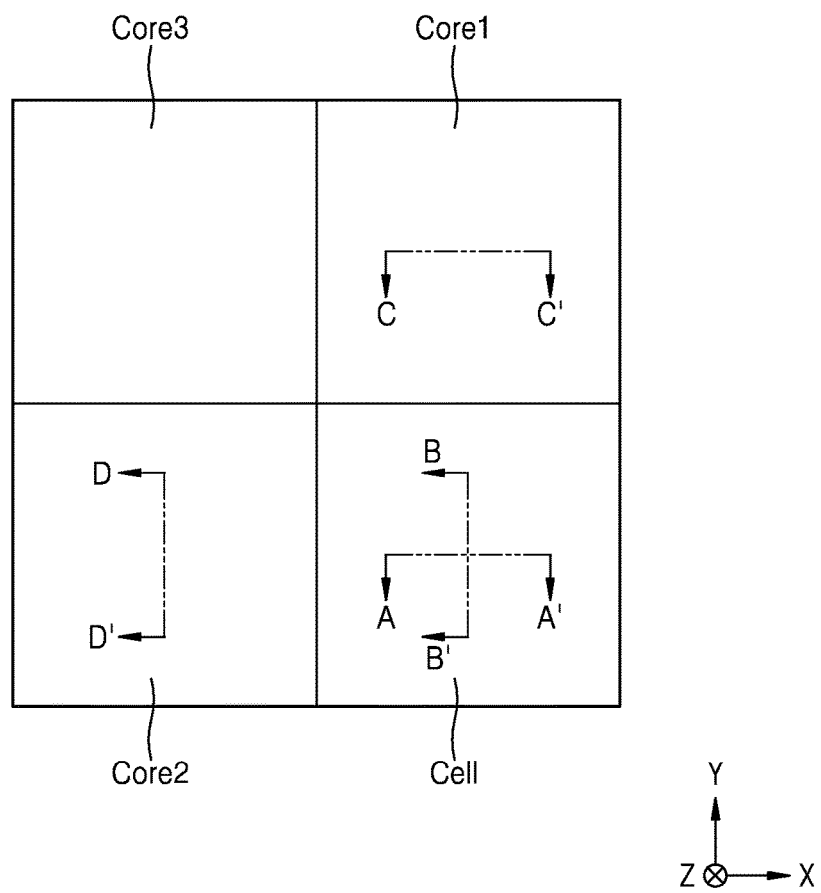
FIG. 2 is a diagram illustrating a plane layout of a cell region and a core region of a semiconductor device, according to an example embodiment.

FIG. 2 is a diagram illustrating a plane layout of a cell region Cell and first to third core regions Core1, Core2, and Core3 of a semiconductor device, according to an example embodiment. FIG. 2 is not meant to be drawn to scale. For example, the Cell, Core1, Core2, and Core3 regions are not meant to be square, nor are they meant to be the same size.

FIGS. 3 to 14C are cross-sectional views and plan views for describing, according to a process sequence, a method of forming a pattern of a semiconductor device, according to an example embodiment. Cell_X, Cell_Y, Core1_X, and Core2_Y of FIGS. 3 to 6A, 7 to 10A, 11A, and 12 to 14A are a cross-sectional view taken along line A-A' of a cell region Cell of FIG. 2, a cross-sectional view taken along line B-B' of the cell region Cell of FIG. 2, a cross-sectional view taken along line C-C' of the first core region Core1 of FIG. 2, and a cross-sectional view taken along line D-D' of the second core region Core2 of FIG. 2, respectively. Cell, Core1, and Core2 of FIGS. 6B, 10B, 11B, 14B, and 14C are a plane view of the cell region Cell of FIG. 2, a plan view of the first core region Core1 of FIG. 2, and a plan view of the second core region Core2 of FIG. 2, respectively.

Figure 3:
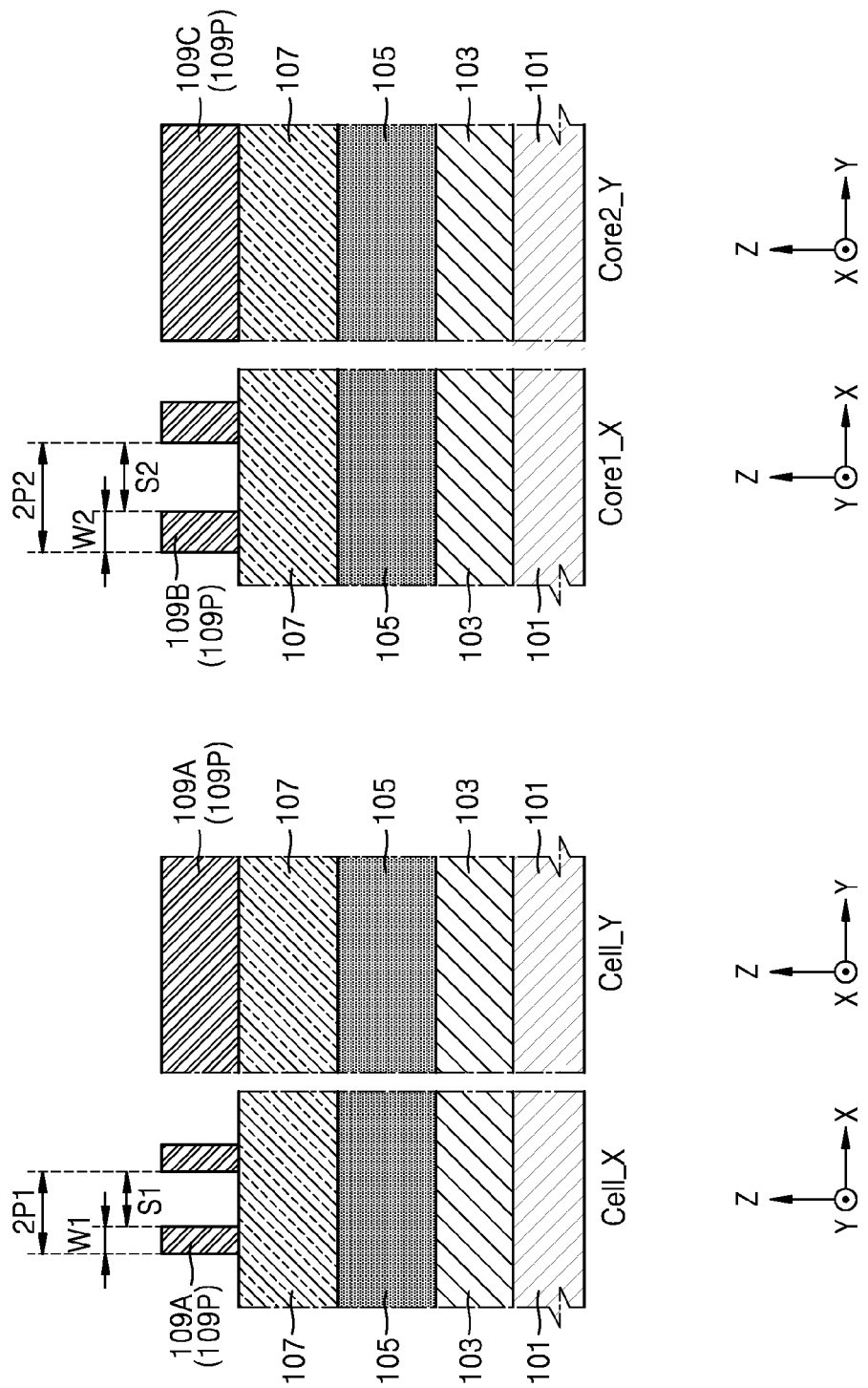

Referring to FIGS. 1 to 3, the semiconductor device may include the cell region Cell and the first to third core regions Core1, Core2, and Core3 adjacent to the cell region Cell.

An etch target film 103, a first mask layer 105, a second mask layer 107, and a first photoresist pattern 109P may be sequentially formed on a substrate 101 including the cell region Cell and the first to third core regions Core1, Core2, and Core3.

The substrate 101 may include a semiconductor material, for example, a group IV semiconductor, a group III-V compound semiconductor, or a group II-VI oxide semiconductor. For example, the group IV semiconductor may include silicon, germanium, or silicon-germanium. The substrate 101 may be a bulk wafer or an epitaxial layer. Alternatively, the substrate 101 may be, for example, a silicon on insulator (SOI) substrate, a gallium-arsenic substrate, or the like. The substrate 101 may include various devices and wiring structures, which are necessary for driving a semiconductor device.

The etch target film 103 may include various materials depending on the use of a target pattern. The etch target film 103 may be a conductive layer necessary for forming a pad or wiring line that is electrically connected to various devices formed in the substrate 101. For example, the etch target film 103 may include a metal such as tungsten W and aluminum Al, a semiconductor such as polysilicon, or a conductive metal nitride.

The first and second mask layer 105 and 107 may include materials having different etch characteristics. The first mask layer 105 may include an oxide film. For example, the first mask layer 105 may include at least one selected from the group consisting of a thermal oxide film, an undoped silicate glass (USG) film, and a high density plasmas (HDP) oxide film. The first mask layer 105 may be formed by an atomic layer deposition (ALD) method or a chemical vapor deposition (CVD) method.

In some example embodiments, the first mask layer 105 may have a multilayer structure. For example, the first mask layer 105 may have a structure including an amorphous carbon layer (ACL), a silicon oxynitride (SiON) film, and an oxide film, stacked in this stated order. However, the inventive concepts are not limited thereto, and the first mask layer 105 may include various materials and structures, which are necessary to uniformly secure the width of a mask pattern.

The second mask layer 107 may include a carbon layer. The carbon layer may include an organic compound including a hydrocarbon compound or a derivative of the hydrocarbon compound. For example, the carbon layer may include an aromatic hydrocarbon, such as phenyl, benzene, or naphthalene. The carbon layer may be formed by a spin coating method. In some example embodiments, the second mask layer 107 may have a multilayer structure. For example, the second mask layer 107 may have a structure including a carbon layer and a SiON-based material film, stacked in this stated order. The carbon layer may be formed by a spin coating method, and the SiON-based material film may be formed by a plasma enhanced chemical vapor deposition (PECVD) method. In some example embodiment, the structure including a carbon layer and a SiON film may be repeated more than twice. However, the inventive concepts are not limited thereto, and the second mask layer 107 may include various materials and structures, which are necessary to uniformly secure the width of a mask pattern.

Although not shown in drawings, an anti-reflective film may be further formed in the second mask layer 107. The anti-reflective film may include a spin coating film including an organic material or an inorganic material, for example, silicon and carbon, or a silicon oxynitride film formed by CVD. The anti-reflective film may hinder or prevent exposure characteristics from being degraded due to diffused reflection during a process of forming a first photoresist pattern 109P.

The first photoresist pattern 109P may include a plurality of first photoresist lines 109A, a plurality of second photoresist lines 109B, and a photoresist film 109C. The plurality of first photoresist lines 109A may extend in a first direction (a Y direction) in the memory cell region Cell, the plurality of second photoresist lines 109B may extend in the first direction (the Y direction) in the first core region Core1, and the photoresist film 109C may completely cover the second core region Core2. The first photoresist pattern 109P may be formed by forming a photoresist layer on the first mask layer 107 and performing a photolithography process. The photolithography process may use, for example, an immersion lithography technique. The immersion lithography technique is a technique of improving a resolving power by filling a fluid having a high refractive index between a lens and an object to be exposed and increasing a numerical aperture (NA). An immersion lithography is in contrast with a dry photolithography process, where there is no fluid between the lens and the object to be exposed. The photolithography process may use, for example an extreme ultraviolet (EUV) lithography technique. The EUV lithography technique is a technique of exposing photoresist to electromagnetic radiation light of extreme ultraviolet wavelengths. EUV is contrasted with UV lithography, which uses for example 248 nm or 193 nm light to expose photoresist.

The plurality of first photoresist lines 109A and the plurality of second photoresist lines 109B may be formed in consideration of a subsequent double patterning process. In other words, a pitch 2P1 between the first photoresist lines 109A may be double the pitch P1 between target patterns. A separation distance S1 between two adjacent first photoresist lines 109A may be greater than the width W1 of each of the plurality of first photoresist lines 109A. In this case, the width W1 of each of the plurality of first photoresist lines 109A may correspond to a minimum feature size of the semiconductor device. Similarly, a pitch 2P2 between the plurality of second photoresist lines 109B may be double a pitch P2 between target patterns. A separation distance S2 between two adjacent second photoresist lines 109B may be greater than the width W2 of each of the plurality of second photoresist lines 109B.

A final pattern that is formed in the cell region Cell may have a relatively narrow width compared to a final pattern that is formed in the first and second core regions Core1 and Core2, and in this case, the pitch P1 between the plurality of first photoresist lines 109A may be less than the pitch P2 between the plurality of second photoresist lines 109B.

Figure 4:
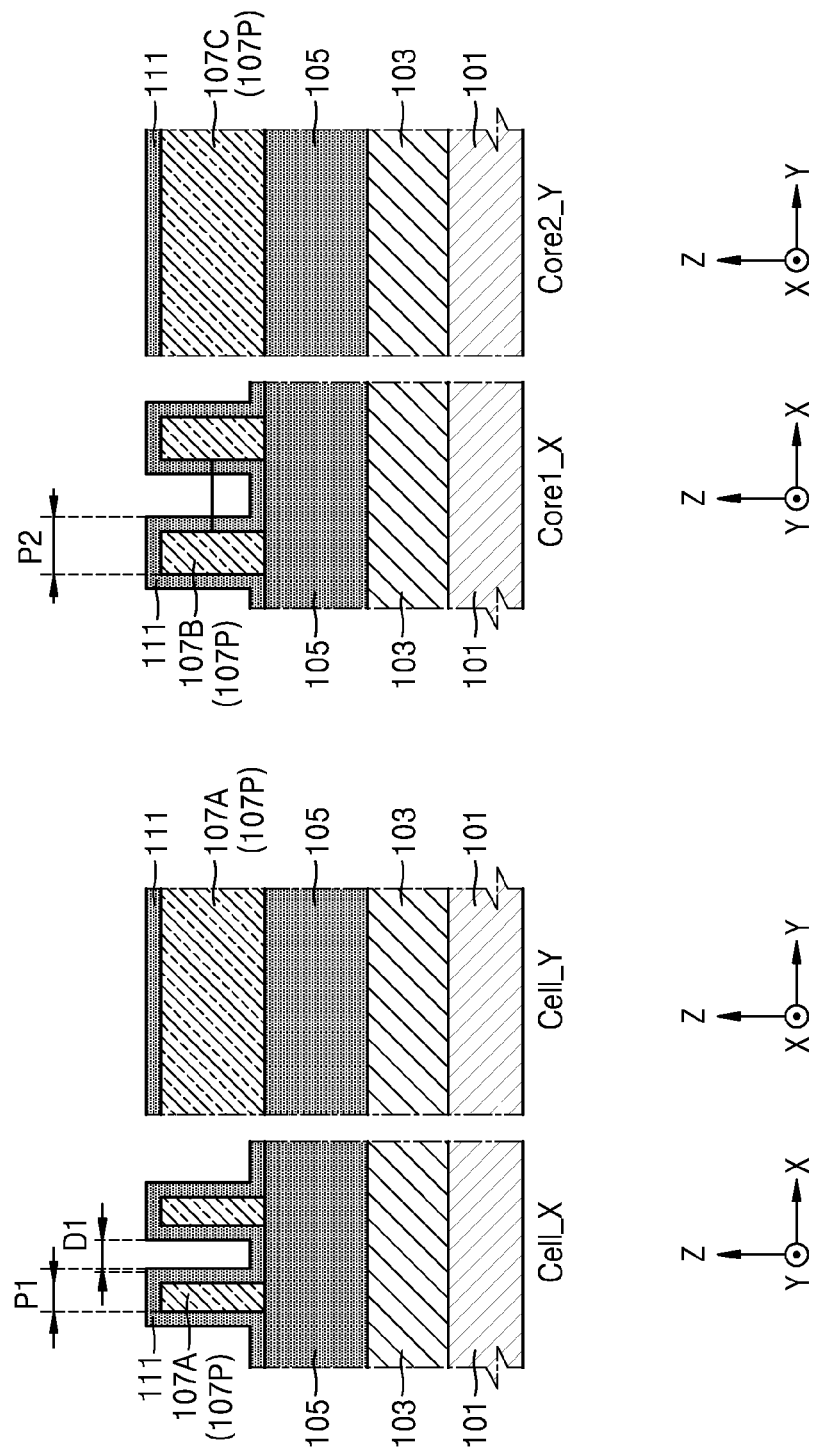

Referring to FIGS. 1, 2, and 4, a first preliminary mask pattern 107P may be formed by etching the second mask layer 107 by using the first photoresist pattern 109P as an etch mask. The first preliminary mask pattern 107P may include a plurality of first preliminary mask lines 107A extending substantially in parallel in the first direction (the Y direction) in the cell region Cell, a plurality of second preliminary mask lines 107B extending substantially in parallel in the first direction (the Y direction) in the first core region Core1, and a preliminary mask film 107C completely covering the first mask layer 105 in the second core region Core2. The width of each of the plurality of first preliminary mask lines 107A and a pitch between the plurality of first preliminary mask lines 107A may correspond to the width W1 of each of the plurality of first photoresist lines 109A and the pitch 2P1 between the plurality of first photoresist lines 109A. Similarly, the width of each of the plurality of second preliminary mask lines 107B and a pitch between the plurality of second preliminary mask lines 107B may correspond to the width W2 of each of the plurality of second photoresist lines 109B and the pitch 2P2 between the plurality of second photoresist lines 109B.

The etch process may be performed by a dry etch method or a reactive ion etch (RIE) method. For example, when the second mask layer 107 is a carbon layer, a plasma etch process using a gas obtained by mixing oxygen $O_2$ and argon Ar may be performed to etch the second mask layer 107. After the etch process, the first photoresist pattern 109P may be removed.

Next, a first spacer mask layer 111 may be formed to cover the side surface and top surface of the first preliminary mask pattern 107P and an exposed top surface of the first mask layer 105. The thickness of the first spacer mask layer 111 may be determined depending on the widths of a plurality of third preliminary mask lines 113A of FIG. 5, to be formed between the plurality of first preliminary mask lines 107A, or the widths of a plurality of fourth preliminary mask lines 113B of FIG. 5, to be formed between the plurality of second preliminary mask lines 107B.

In some example embodiments, the widths of the plurality of first and third preliminary mask lines 107A and 113A that are formed in the cell region Cell may be equal to each other. In this case, a width D1 of a space that is defined by a structure including adjacent first preliminary mask lines 107A and the first spacer mask layer 111 formed on the side surfaces thereof may be equal to the width W1 of each of the first preliminary mask lines 107A. Similarly, the widths of the plurality of second and fourth preliminary mask lines 107B and 113B that are formed in the first core region Core1 may be equal to each other by adjusting the thickness of the first spacer mask layer 111. However, the inventive concepts are not limited thereof.

The first spacer mask layer 111 may include a material having etch selectivity that is different from that of the first preliminary mask pattern 107P. For example, when the first preliminary mask pattern 107P includes a carbon-containing material, the first spacer mask layer 111 may include oxide, nitride, or oxynitride. For example, the first spacer mask layer 111 may include silicon oxide, silicon nitride, or silicon oxynitride. The first spacer mask layer 111 may be formed by a thermal atomic layer deposition method or a plasma atomic layer deposition method, thereby reducing a stress that is applied to the first preliminary mask pattern 107P.

Figure 5:
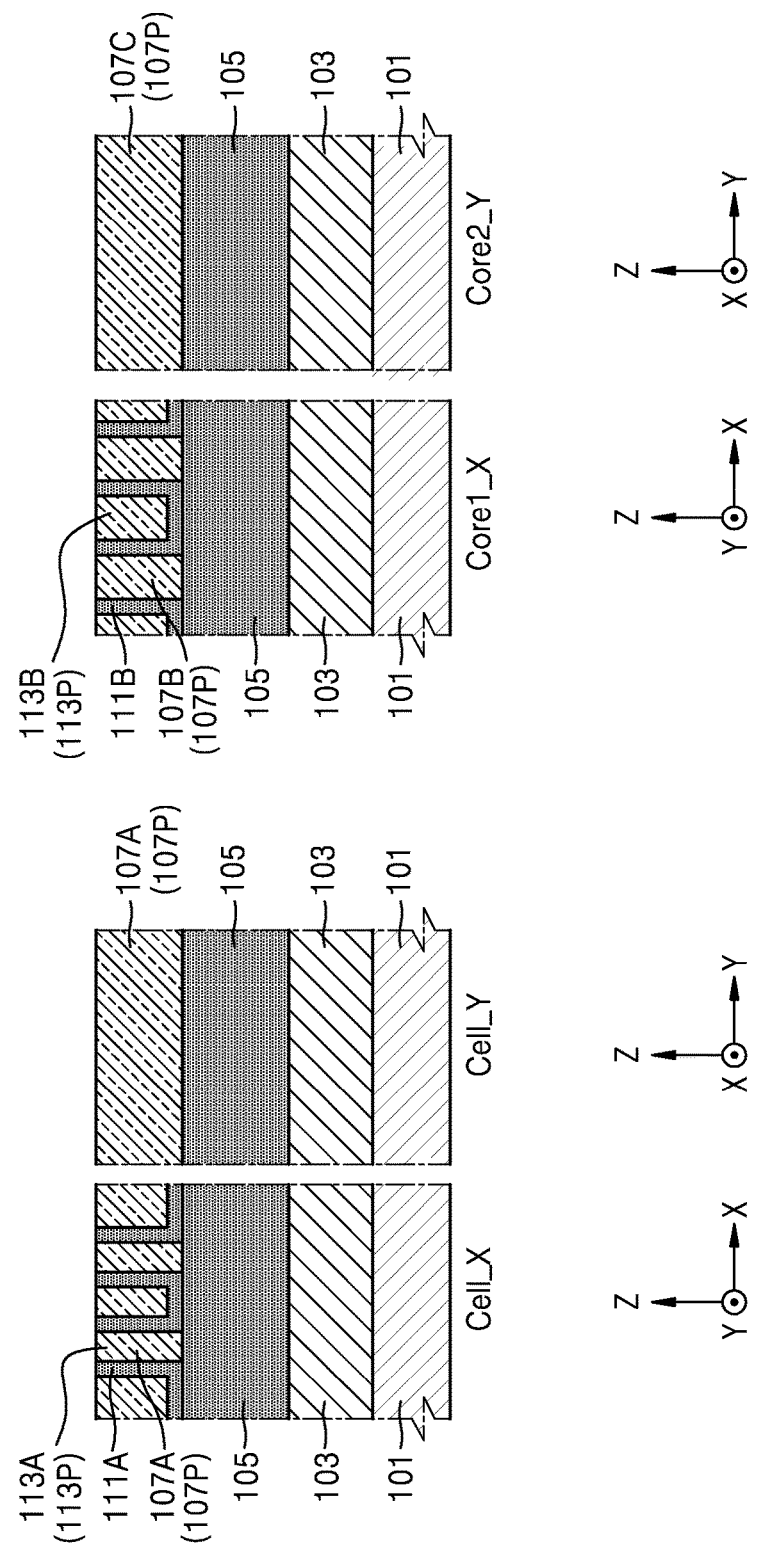
Figure 6A:
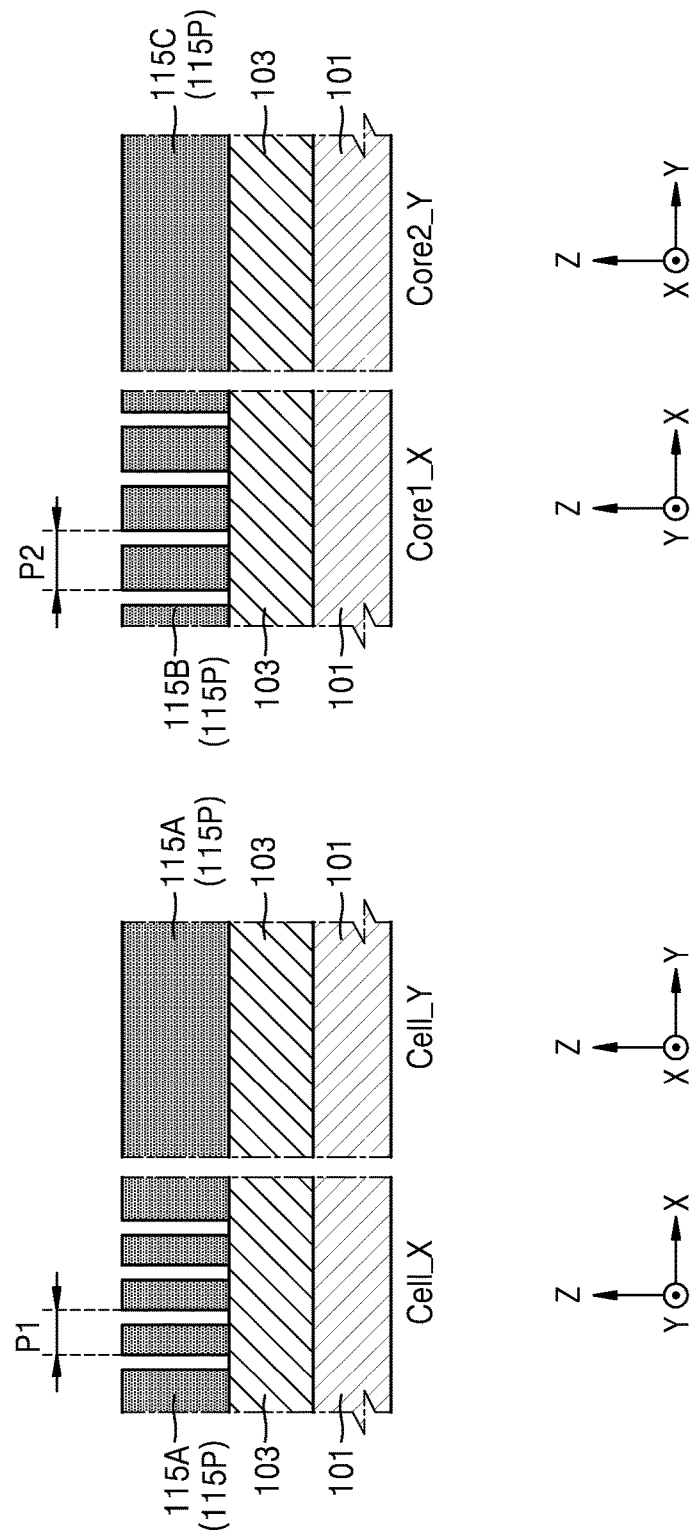
Figure 6B:
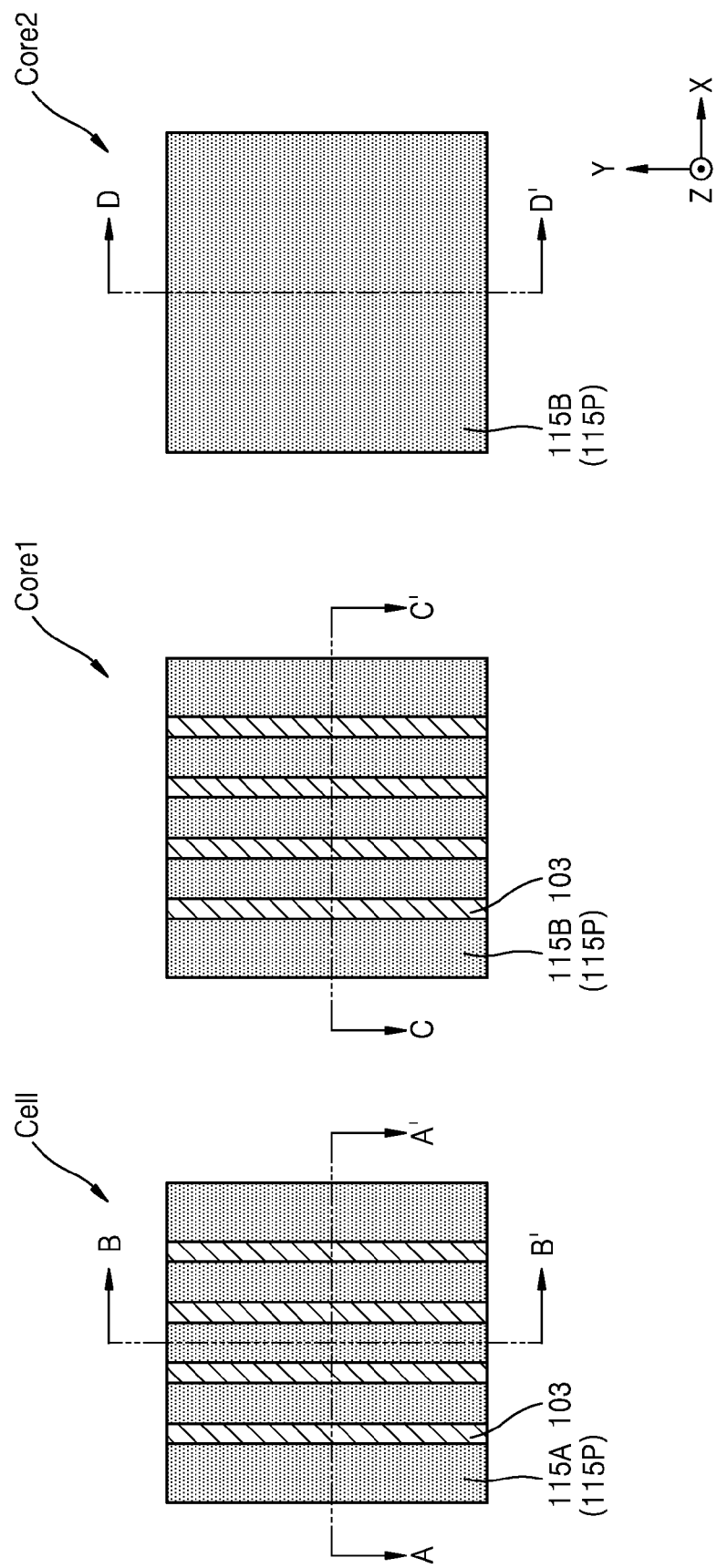

Referring to FIGS. 1, 2, and 5, a third mask layer including the same material as the first preliminary mask pattern 107P may be formed on the resultant structure of FIG. 4. As exemplified in FIG. 3, the third mask layer may include the same carbon layer as the first preliminary mask pattern 107P. Accordingly, the etch selectivity of the first preliminary mask pattern 107P may be equal to that of the third mask layer. The third mask layer may be formed by a spin coating method.

The third mask layer may fill spaces between the plurality of first preliminary mask lines 107A of the cell region Cell and spaces between the plurality of second preliminary mask lines 107B of the first core region Core1, and may completely cover the entire surface of the first mask layer 105 of the second core region Core2.

Next, the entire surface of the third mask layer may be etched until the top surfaces of the plurality of first preliminary mask patterns 107P are exposed. Accordingly, a plurality of first spacers 111A covering the side surfaces of the plurality of first preliminary mask lines 107A and a plurality of second spacers 111B covering the side surfaces of the plurality of second preliminary mask lines 107B may be formed at the same time. In addition, the third mask layer may remain in spaces, which are defined by a structure including the first preliminary mask lines 107A and the first spacers 111A and a structure including the second preliminary mask lines 107B and the second spacers 111B, and thus, a second preliminary mask pattern 113P may be formed. The second preliminary mask pattern 113P may include a third preliminary mask line 113A and a fourth preliminary mask line 113B.

In detail, in the cell region Cell, the third preliminary mask line 113A may be formed between structures including the plurality of first preliminary mask lines 107A and the plurality of first spacers 111A. In this case, a preliminary mask pattern including the plurality of first and third preliminary mask lines 107A and 113A may have a pitch P1 between patterns to be formed in the cell region Cell. Similarly, in the first core region Core1, the fourth preliminary mask line 113B may be formed between structures including the plurality of second preliminary mask lines 107B and the plurality of second spacers 111B. In this case, a preliminary mask pattern including the plurality of second and fourth preliminary mask lines 107B and 113B may have a pitch P2 between patterns to be formed in the first core region Core1.

Referring to FIGS. 1, 2, 6A, and 6B, the first and second spacer layers 111A and 111B may be etched until the top surface of the first mask layer 105 is exposed between the plurality of first and third preliminary mask lines 107A and 113A and between the plurality of second and fourth preliminary mask lines 107B and 113B.

Next, a first mask pattern 115P may be formed by etching the first mask layer 105 by using the first and second preliminary mask patterns 107P and 113P as an etch mask (operation S101). The first mask pattern 115P may include a plurality of first mask lines 115A extending substantially in the first direction (the Y direction) in the cell region Cell, a plurality of second mask lines 115B extending substantially in the first direction (the Y direction) in the first core region Core1, and a mask film 115C covering the entire surface of the second core region Core2. As described above, the first mask lines 115A may be formed to have a pitch P1 that is half the pitch 2P1 between the first photoresist lines 109A of FIG. 3. In addition, the second mask lines 115B may be formed to have a pitch P2 that is half the pitch 2P2 between the second photoresist lines 109B of FIG. 3.

Referring to FIGS. 1, 2, and 7, a fourth mask layer 117 and a second photoresist pattern 119P may be sequentially formed on the resultants structure of FIG. 6.

The fourth mask layer 117 may include a material having etch selectivity that is different from that of the first mask pattern 115P. As exemplified in FIG. 6, when the first mask pattern 115P includes oxide, the fourth mask layer 117 may include a carbon layer. Details of the carbon layer are the same as those described with reference to FIG. 3. In some example embodiments, the fourth mask layer 117 may have a multilayer structure. For example, the fourth mask layer 117 may have a structure including a carbon layer and a silicon oxynitride film, stacked in this stated order. In some example embodiment, the structure including a carbon layer and a silicon oxynitride film may be repeated more than twice. The carbon layer may be formed by a spin coating method, and the silicon oxynitride film may be formed by a PECVD method.

Although not shown in drawings, an anti-reflective film may be further formed in the fourth mask layer 117. The anti-reflective film may include a spin coating film including an organic material or an inorganic material, for example, silicon and carbon, or a silicon oxynitride film formed by CVD.

The second photoresist pattern 119P may include a plurality of third photoresist lines 119A, a plurality of fourth photoresist lines 119C, and a photoresist film 119B. The plurality of third photoresist lines 119A may extend in a second direction (an X direction) in the memory cell region Cell, the plurality of fourth photoresist lines 119C may extend in the second direction (the X direction) in the second core region Core2, and the photoresist film 119B may completely cover the first core region Core1. The second photoresist pattern 119P may be formed through a photolithography process after a photoresist layer is formed on the third mask pattern 115P. The photolithography process may use, for example, an immersion lithography technique or an extreme ultraviolet (EUV) lithography technique.

As described above, the photoresist pattern 119P may be formed in consideration of a subsequent double patterning process. In other words, a pitch 2P3 between the plurality of third photoresist lines 119A may be double a pitch P3 between target patterns. A separation distance S3 between the plurality of third photoresist lines 119A may be greater than the width W3 of each of the plurality of third photoresist lines 119A. In some example embodiments, the pitch 2P3 between the plurality of third photoresist lines 119A and the width W3 of each of the plurality of third photoresist lines 119A may be respectively equal to the pitch 2P1 between the plurality of first photoresist lines 109A and the width W1 of each of the plurality of first photoresist lines 109A of FIG. 3. However, the inventive concepts are not limited thereto. Similarly, a pitch 2P4 between the plurality of fourth photoresist lines 119C may be double a pitch P4 between target patterns. A separation distance S4 between the plurality of fourth photoresist lines 119C may be greater than the width W4 of each of the plurality of fourth photoresist lines 119C.

Figure 8:
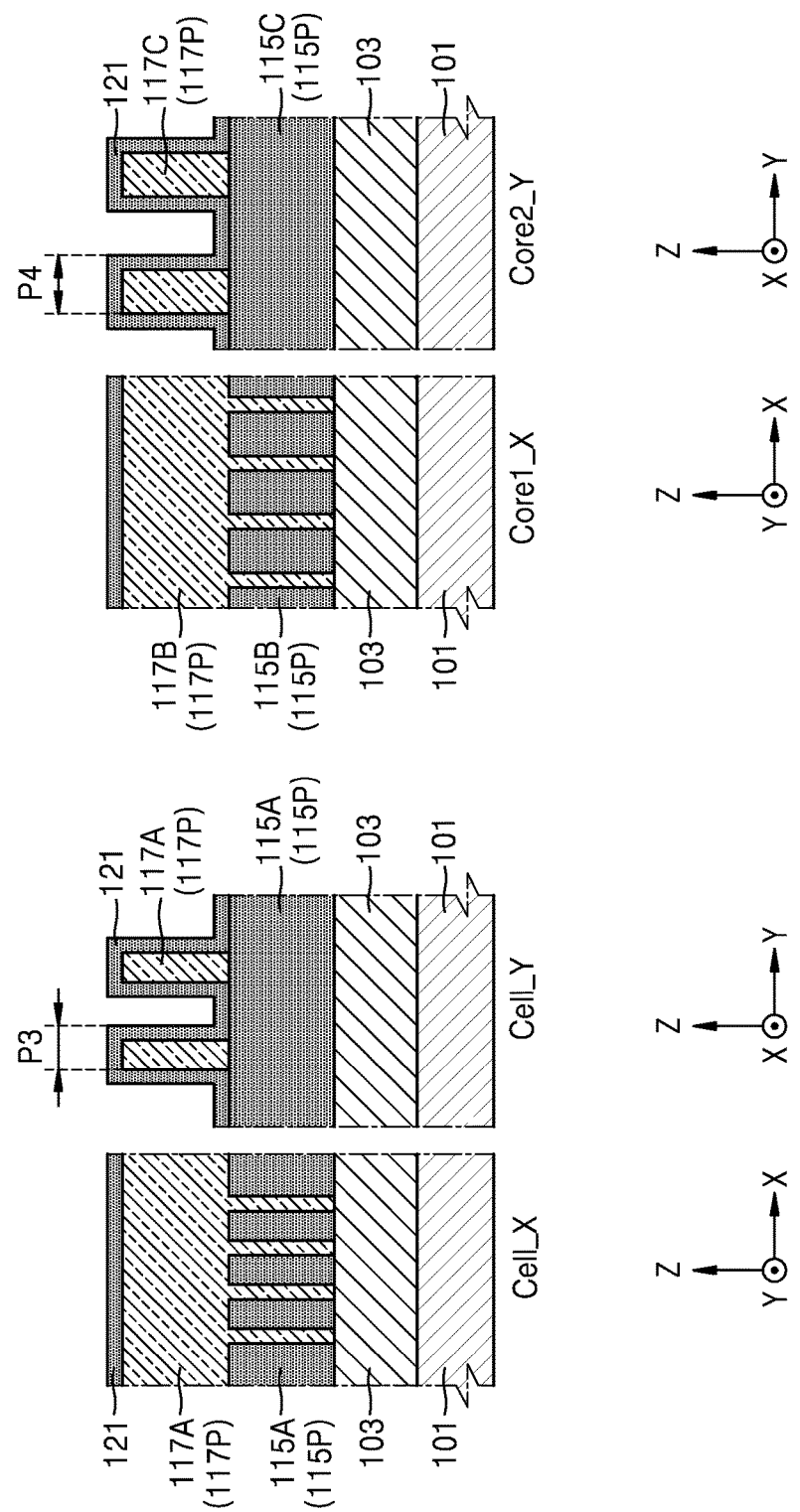

Referring to FIGS. 1, 2, and 8, a third preliminary mask pattern 117P may be formed by etching the fourth mask layer 117 of FIG. 7 by using the second photoresist pattern 119P as an etch mask. The third preliminary mask pattern 117P may include a plurality of fifth preliminary mask lines 117A extending substantially in parallel in the second direction (the X direction) in the cell region Cell, a preliminary mask film 117B completely covering the first mask pattern 115P in the first core region Core1, and a plurality of sixth preliminary mask lines 117C extending substantially in parallel in the second direction (the X direction) in the second core region Core2. The width of each of the plurality of fifth preliminary mask lines 117A and a pitch between the plurality of fifth preliminary mask lines 117A may correspond to the width W3 of each of the plurality of third photoresist lines 119A and the pitch 2P3 between the plurality of third photoresist lines 119A. Similarly, the width of each of the plurality of sixth preliminary mask lines 117C and a pitch between the plurality of sixth preliminary mask lines 117C may correspond to the width W4 of each of the plurality of fourth photoresist lines 119C and the pitch 2P4 between the plurality of fourth photoresist lines 119C.

The etch process may be performed by a dry etch method or an RIE method. For example, when the fourth mask layer 117 is a carbon layer, a plasma etch process using a gas obtained by mixing oxygen and argon may be performed to etch the fourth mask layer 117. After the etch process, the second photoresist pattern 119P may be removed.

Next, a second spacer mask layer 121 may be formed to cover the side surface and top surface of the third preliminary mask pattern 117P and an exposed top surface of the first mask pattern 115P. The thickness of the second spacer mask layer 121 may be determined depending on the widths of a plurality of seventh preliminary mask lines 123A of FIG. 9, to be formed between the plurality of fifth preliminary mask lines 117A, or the widths of a plurality of eighth preliminary mask lines 123C of FIG. 9, to be formed between the plurality of sixth preliminary mask lines 117C. In some example embodiment, the widths of the plurality of fifth and seventh preliminary mask lines 117A and 123A that are formed in the cell region Cell may be equal to each other.

The second spacer mask layer 121 may include a material having etch selectivity that is different from that of the third preliminary mask pattern 117P. For example, when the third preliminary mask pattern 117P includes a carbon-containing material, the second spacer mask layer 121 may include oxide, nitride, or oxynitride. Detailed descriptions of the second spacer mask layer 121 are the same as those of the first spacer mask layer 111 of FIG. 4, provided above.

Figure 9:
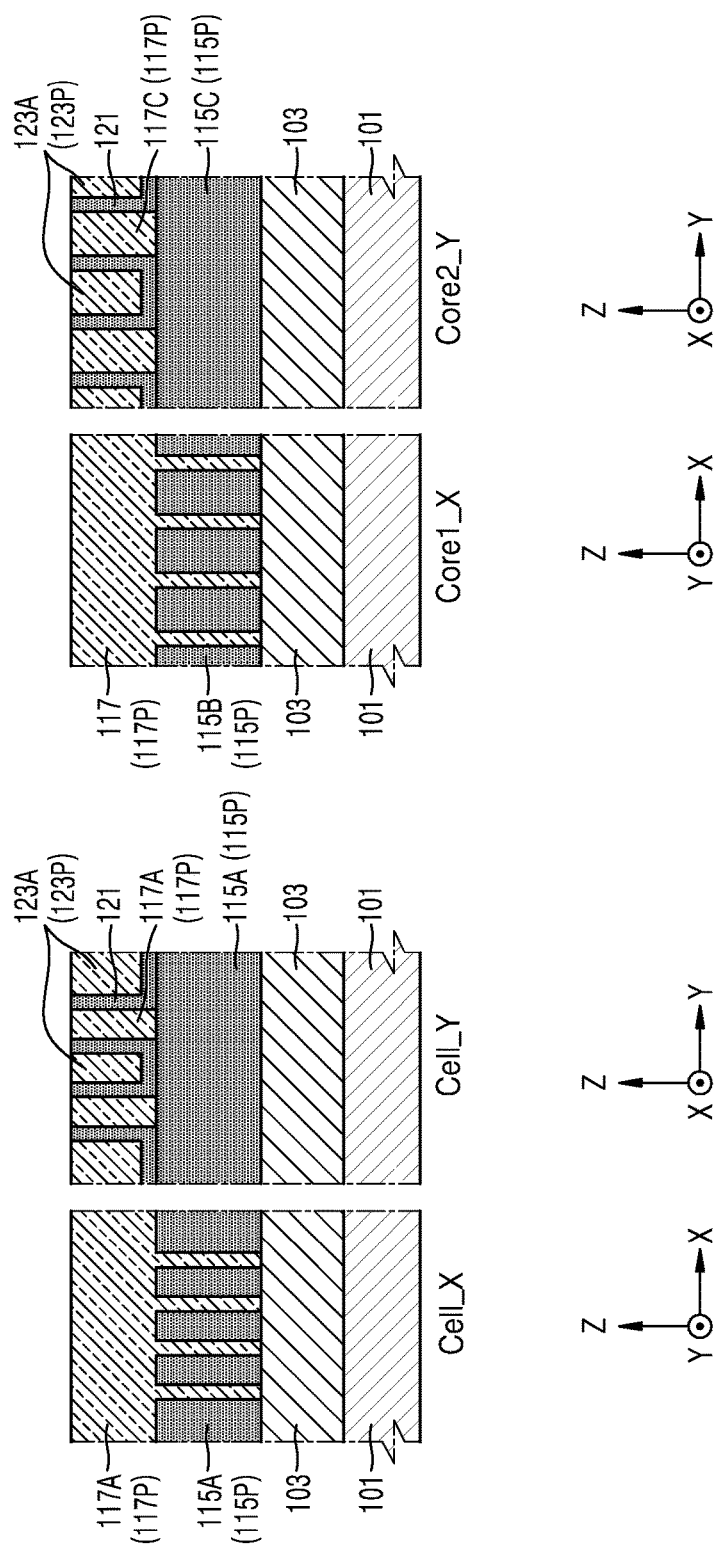

Referring to FIGS. 1, 2, and 9, a fifth mask layer including the same material as the third preliminary mask pattern 117P may be formed on the resultant structure of FIG. 8.

The fifth mask layer may fill spaces between the plurality of fifth preliminary mask lines 117A of the cell region Cell and spaces between the plurality of sixth preliminary mask lines 117C of the second core region Core2, and may completely cover the entire surface of the first mask pattern 115P of the first core region Core1.

Next, the entire surface of the fifth mask layer may be etched until the top surface of the third preliminary mask pattern 117P is exposed. Accordingly, a plurality of third spacers 121A covering the side surfaces of the plurality of fifth preliminary mask lines 117A and a plurality of fourth spacers 121C covering the side surfaces of the plurality of sixth preliminary mask lines 117C may be formed at the same time. In addition, the fifth mask layer may remain in spaces, which are defined by a structure including the fifth preliminary mask lines 117A and the third spacers 121A and a structure including the sixth preliminary mask lines 117C and the fourth spacers 121C, and thus, a fourth preliminary mask pattern 123P may be formed. The fourth preliminary mask pattern 123P may include a seventh preliminary mask line 123A, a preliminary mask film 123B, and the eight preliminary mask line 123C.

In detail, in the cell region Cell, the seventh preliminary mask line 123A may be formed between structures including the plurality of fifth preliminary mask lines 117A and the plurality of third spacers 121A. In this case, a preliminary mask pattern including the plurality of fifth and seventh preliminary mask lines 117A and 123A may have a pitch P3 between patterns to be formed in the cell region Cell. Similarly, in the second core region Core2, the eighth preliminary mask line 123C may be formed between structures including the plurality of sixth preliminary mask lines 117C and the plurality of fourth spacers 121C. In this case, a preliminary mask pattern including the plurality of sixth and eighth preliminary mask lines 117C and 123C may have a pitch P4 between patterns to be formed in the second core region Core2. The preliminary mask film 123B may be formed to cover the entire surface of the first core region Core1.

Referring to FIGS. 1, 2, 10A, and 10B, the third and fourth spacer layers 121A and 121C may be etched until the top surface of the first mask pattern 115P is exposed between the plurality of fifth and seventh preliminary mask lines 117A and 123A and between the plurality of sixth and eighth preliminary mask lines 117C and 123C. Accordingly, a second mask pattern including the third and fourth preliminary mask patterns 117P and 123P may be formed on the first mask pattern 115P (operation S103).

Figure 10B:
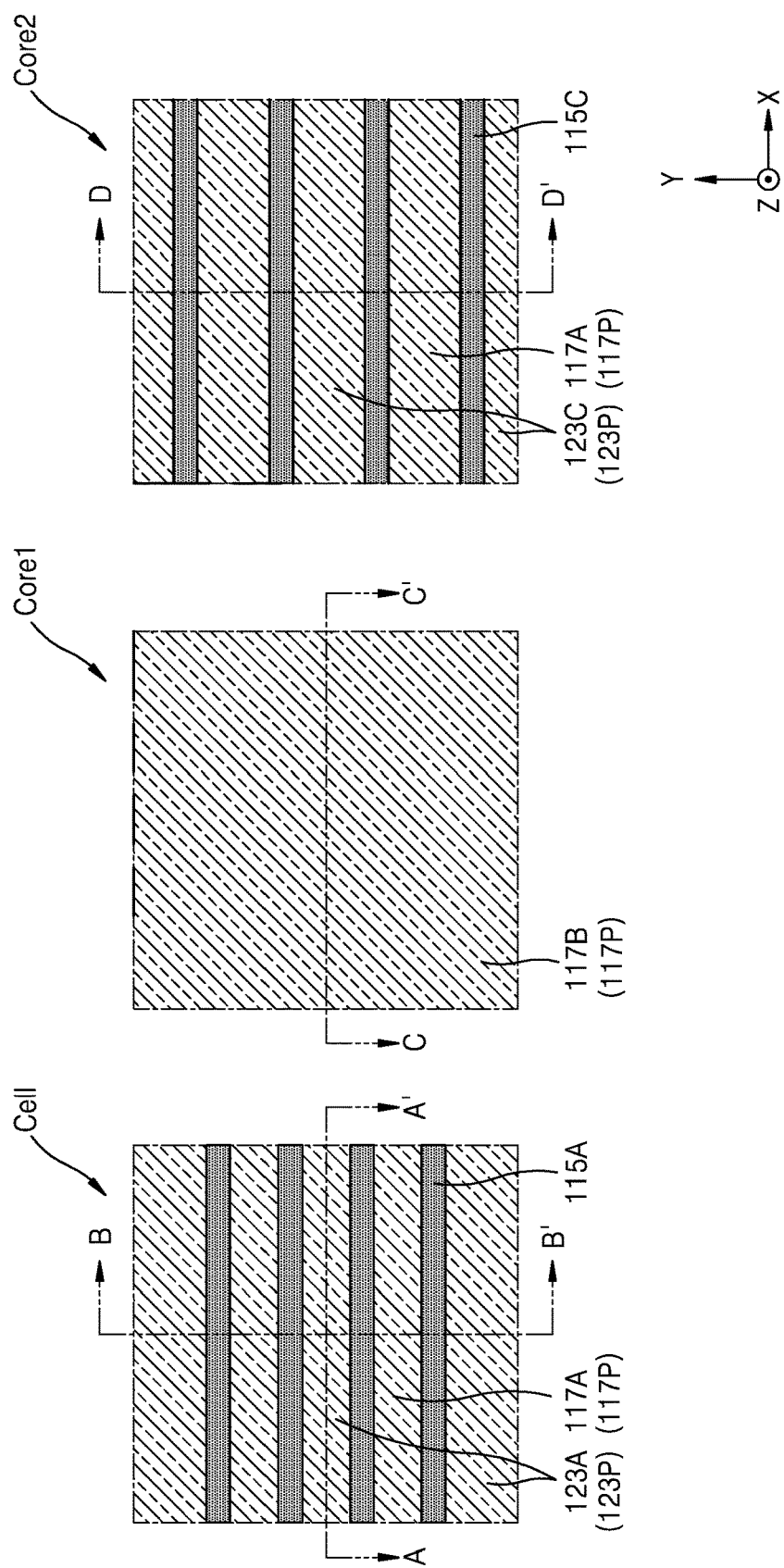
Figure 11A:
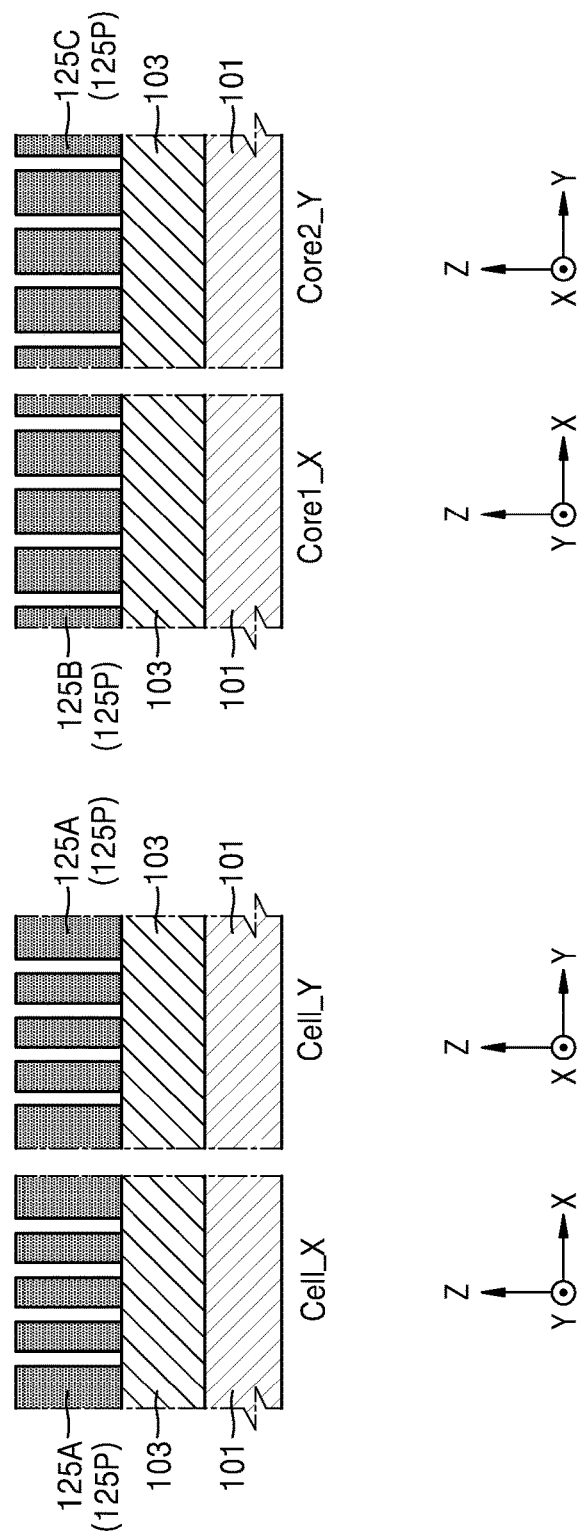
Figure 11B:
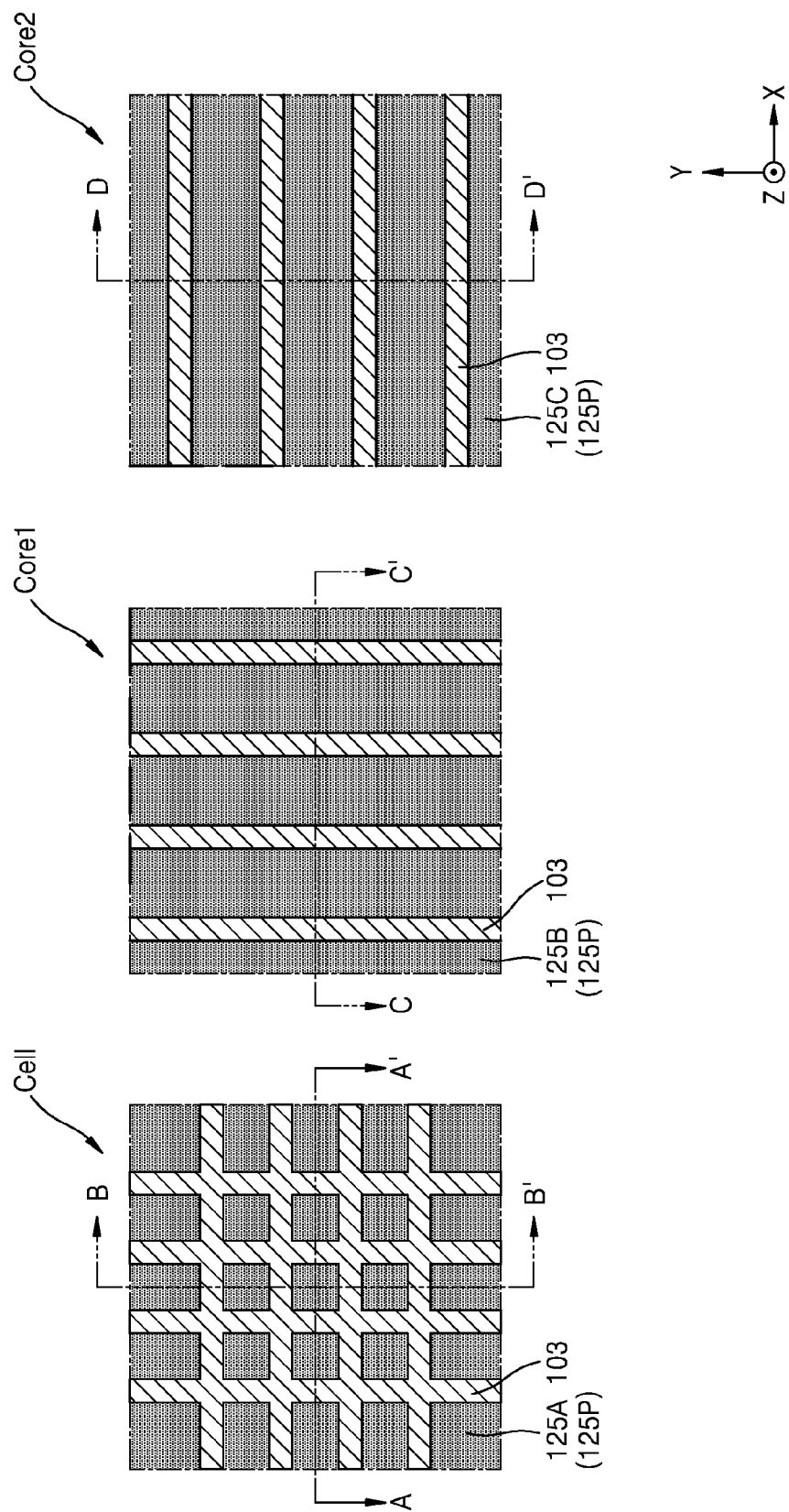

Referring to FIGS. 1, 2, 11A, and 11B, a third mask pattern 125P may be formed by etching the first mask pattern 115P of FIGS. 10A and 10B by using the second mask pattern, which includes the third and fourth preliminary mask patterns 117P and 123P, as an etch mask (operation S105).

The third mask pattern 125P may include a plurality of island-type masks 125A spaced apart in a matrix in the cell region Cell, a plurality of third mask lines 125B extending substantially in the first direction (the Y direction), and a plurality of fourth mask lines 125C extending substantially in the second direction (the X direction).

As described above, the island-type masks 125A may have a pitch P1 that is half the pitch 2P1 between the first photoresist lines 109A in the second direction (the X direction) and have a pitch P3 that is half the pitch 2P3 between the third photoresist lines 119A in the first direction (the Y direction). In addition, the third mask lines 125B may have a pitch P2 that is half the pitch 2P2 between the second photoresist lines 109B in the second direction (the X direction). The fourth mask lines 125C may have a pitch P4 that is half the pitch 2P4 between the fourth photoresist lines 119C in the first direction (the Y direction).

Figure 12:
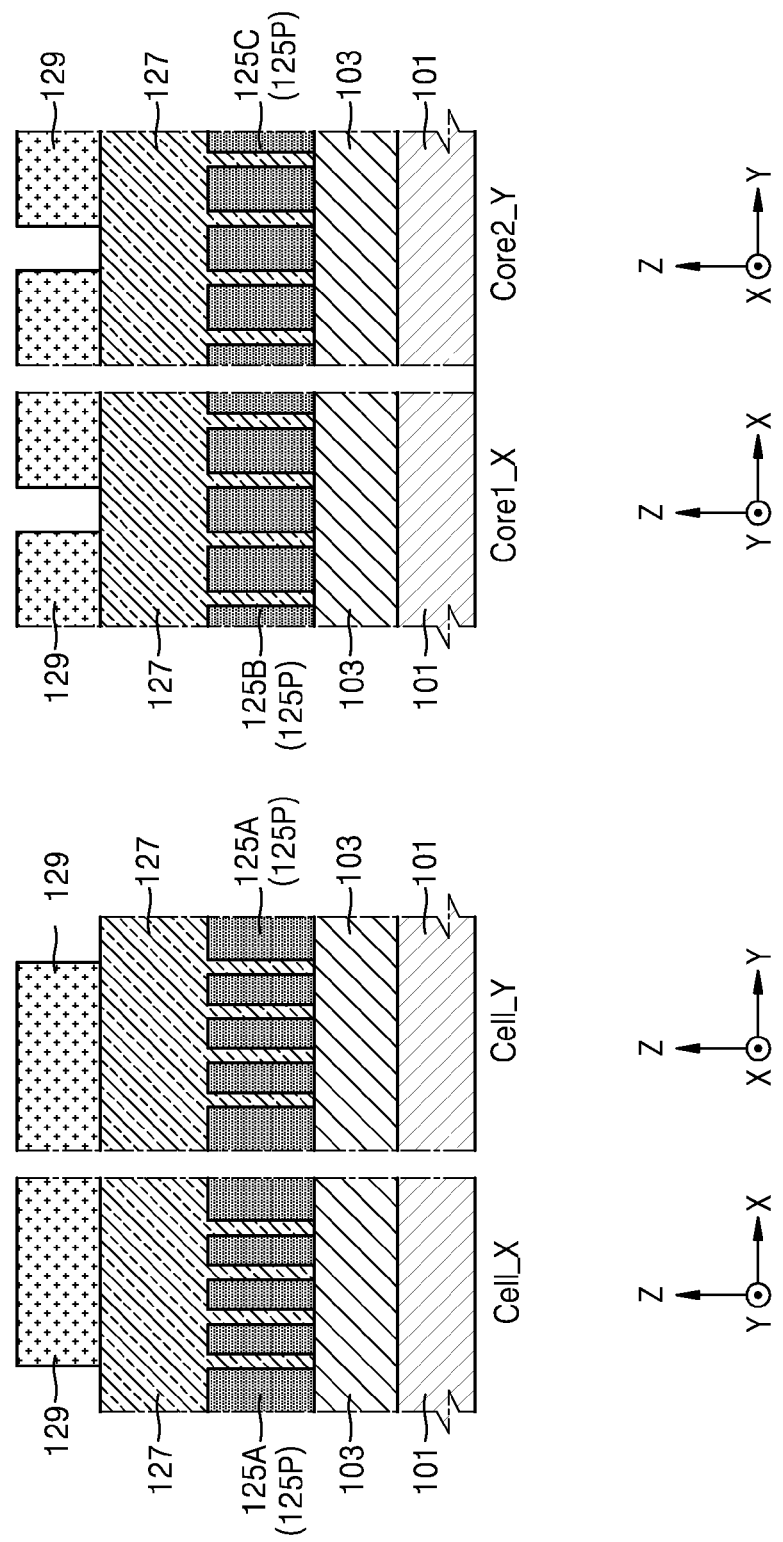

Referring to FIGS. 1, 2, and 12, a trimming process may be performed to remove an unnecessary portion from the third mask pattern 125P. A trimming mask layer 127 and a trimming photoresist pattern 129P may be sequentially formed on the third mask pattern 125P. The trimming mask may have a substantially larger pitch than the first mask and the second mask. Accordingly, a trimming photolithography process might not be done with an immersion process, or with a similar or same photolithography process used to form the first photoresist pattern and the second photoresist pattern. For example, the trimming process may use dry photolithography, while the first and second photolithography processes might use immersion lithography. In addition, a wavelength of light used in the trimming photolithography process may be larger than a wavelength of light used in the first and second photolithography process.

Figure 13:
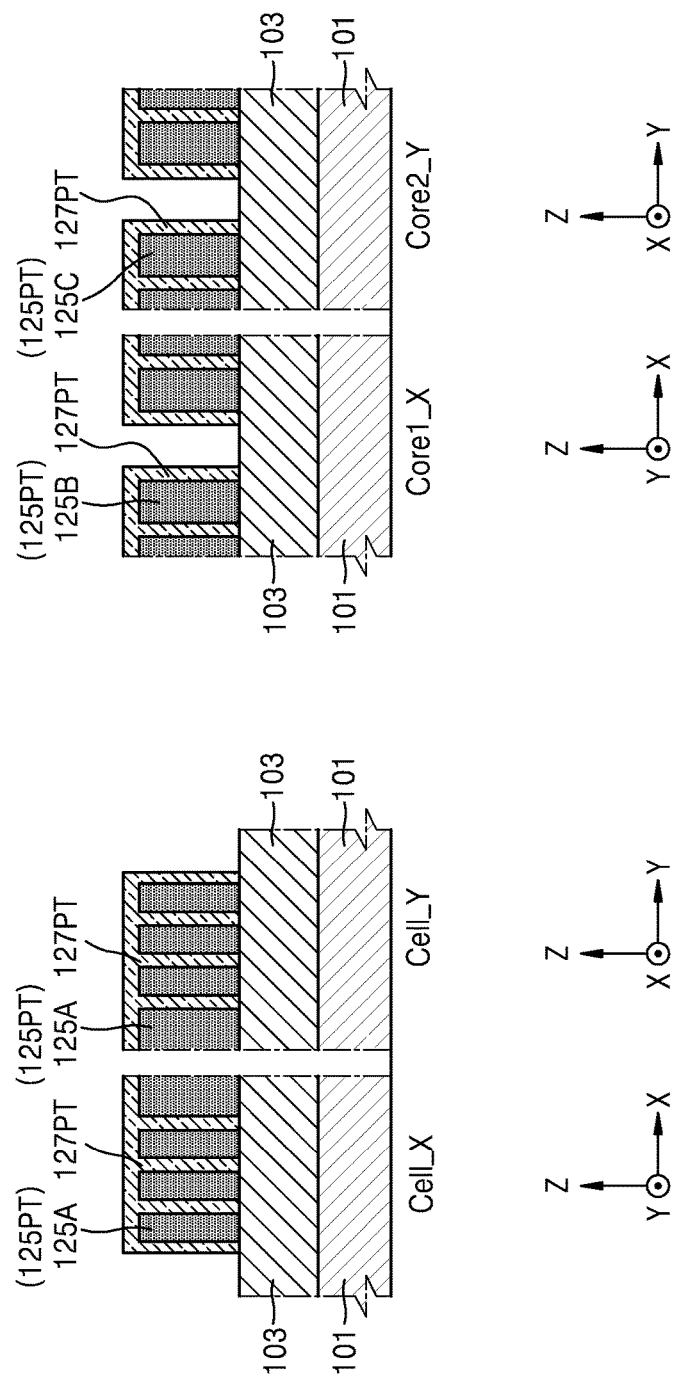

Referring to FIGS. 1, 2, and 13, a trimming mask pattern 127PT and a trimmed third mask pattern 125PT may be formed by etching the trimming mask layer 127 and the third mask pattern 125P of FIG. 12 by using the trimming photoresist pattern 129P as an etch mask, and then the trimming mask pattern 127PT may be removed.

Referring to FIGS. 1, 2, 14A, and 14B, target patterns 103P may be formed by etching the etch target film 103 by using the trimmed third mask pattern 125PT of FIG. 13 as an etch mask. The target patterns 103P may include a plurality of island-type first patterns 103A spaced apart in a matrix in the cell region Cell, a plurality of line-type second patterns 103B extending substantially in the first direction (the Y direction), and a plurality of line-type third patterns 103C extending substantially in the second direction (the X direction).

As described above, the island-type first patterns 103A may have a pitch P1 that is half the pitch 2P1 between the first photoresist lines 109A in the second direction (the X direction) and have a pitch P3 that is half the pitch 2P3 between the third photoresist lines 119A in the first direction (the Y direction). In addition, the line-type second patterns 103B may have a pitch P2 that is half the pitch 2P2 between the second photoresist lines 109B in the second direction (the X direction). The line-type third patterns 103C may have a pitch P4 that is half the pitch 2P4 between the fourth photoresist lines 119C in the first direction (the Y direction).

In this manner, the second and third patterns 103B and 103C of the first and second core regions Core1 and Core2 may be separated depending on a dominant direction and formed through a plurality of exposure processes introduced to form the first patterns 103A in the cell region Cell. The first patterns 103A of the cell region Cell may be formed by a double patterning process to have narrow widths, and the second patterns 103B of the first core region Core1 and the third patterns 103C of the second core region Core2 may also be formed by a double patterning process and thus have narrow widths that are advantageous in the first and second core regions Core1 and Core2, respectively.

In detail, a pitch of patterns that are formed in the cell region Cell is reduced depending on requirements for high integration of semiconductor devices. In order to solve a limit of an exposure process and an alignment margin problem, the patterning of the cell region Cell is performed by using a plurality of exposure processes with respect to patterns having different directions. Recently, patterns having narrow widths are advantageous in the first and second core regions Core1 and Core2 as well as in the cell region Cell. Accordingly, an alignment margin between an upper pattern and a lower pattern may decrease in the first and second core regions Core1 and Core2. In particular, when narrow patterns extending substantially in different directions in the first and second core regions Core1 and Core2 are formed by a single patterning process, electrical connection defects may frequently occur even if very small alignment error occurs.

The method of forming a pattern of a semiconductor device, according to the present example embodiment, may include an operation in which patterns, which are formed in the first and second core regions Core1 and Core2, are separated based on a dominant direction, such as the first and second directions (the Y and X directions), and are formed through a plurality of exposure processes (operations S101 and S103) that are used in the patterning of the cell region Cell. In other words, a risk due to an alignment error of patterns that are formed in the first and second core regions Core1 and Core2 may be reduced by separately forming the patterns based on a dominant direction. In addition, as each of exposure processes for forming narrow patterns of the core regions Core1 and Core2 is performed contemporaneously with the plurality of exposure processes (operations S101 and S103) that are necessarily performed to form narrow patterns of the cell region Cell, the number of exposure processes may be reduced and thus a process cost may be reduced.

In FIGS. 3 to 14B, although the first core region Core1 includes only patterns extending substantially in the first direction (the Y direction) and the second core region Core2 includes only patterns extending substantially in the second direction (the X direction), the inventive concepts are not limited thereto. In some example embodiments, the first core region Core1 may include patterns extending substantially in the first direction (the Y direction) and patterns extending substantially in the second direction (the X direction). In this case, patterns of the first core region Core1 may be selectively defined by the first photoresist pattern 109P of FIG. 3 or the second photoresist pattern 119P of FIG. 7 depending on whether an extending direction of each of the patterns of the first core region Core1 is the first direction (the Y direction) or the second direction (the X direction). Similarly, the second core region Core2 may include patterns extending substantially in the first direction (the Y direction) and patterns extending substantially in the second direction (the X direction).

Figure 14A:
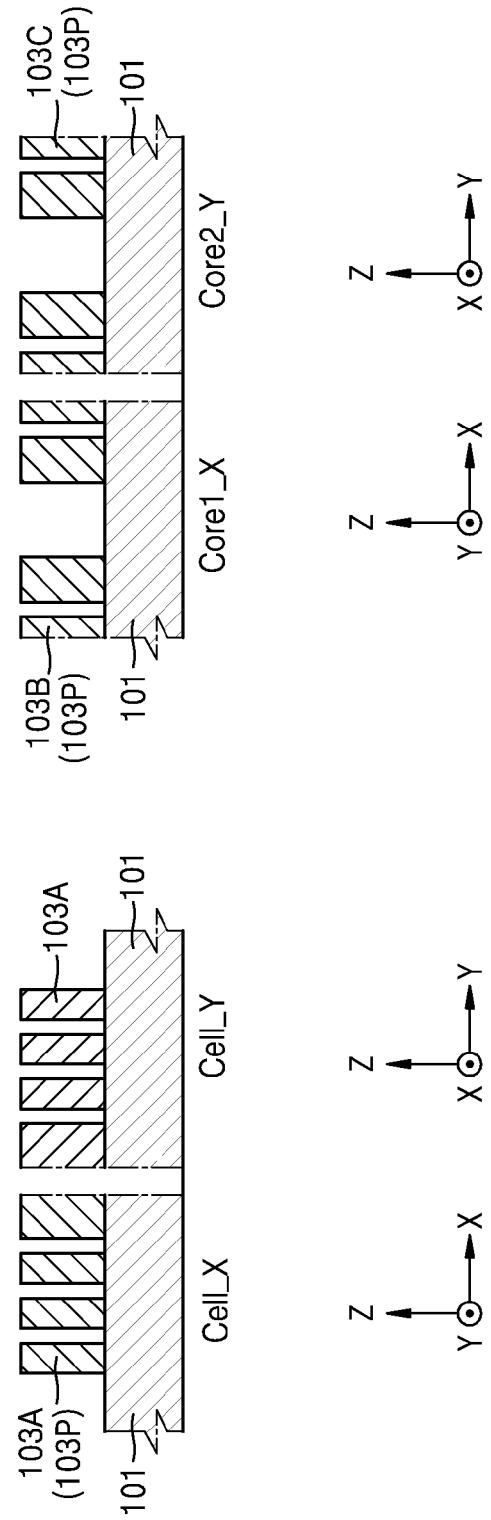
Figure 14B:
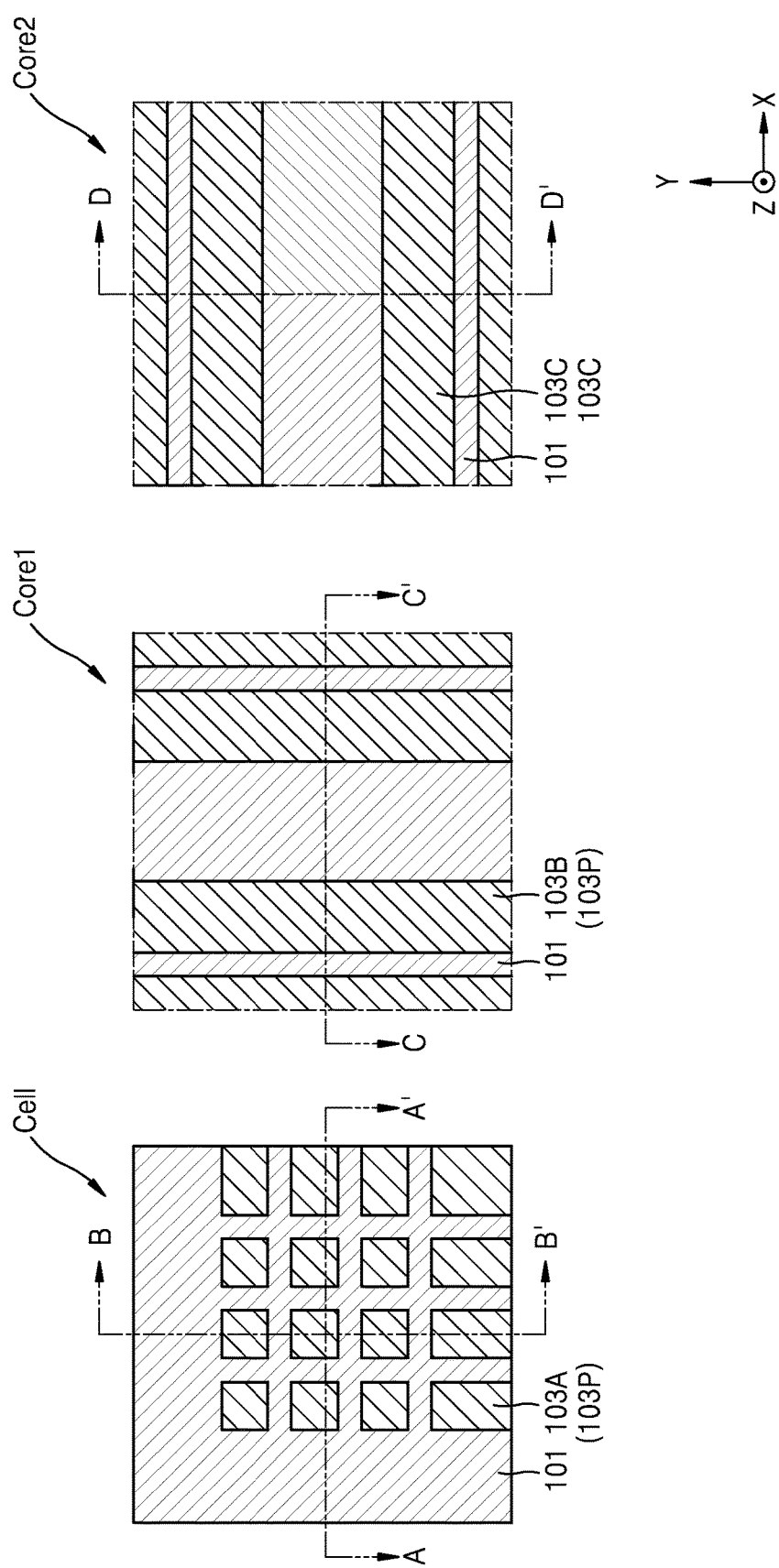

In FIGS. 14A and 14B, although each of the line-type second and third patterns 103B and 103C has a constant width, the inventive concepts are not limited thereto. Referring to FIG. 14C, a line-type second pattern 203B may have a varied width including a first width, Wa, and a second width, Wb. The form of the line-type second pattern 203B may correspond to a first photoresist line that is formed by a first exposure process. Accordingly, the line-type second pattern 203B may be formed to extend in the first direction (the Y direction) and have various widths by adjusting the form of the second photoresist line 109B of FIG. 3. Similarly, a line-type third pattern 203C may also have a varied width. The form of the line-type third pattern 203C may correspond to a second photoresist line that is formed by a second exposure process. Accordingly, the line-type third pattern 203C may be formed to extend in the second direction (the X direction) and have various widths by adjusting the form of the fourth photoresist line 119C of FIG. 7.

It will be understood by a person having ordinary skill in the art that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

A specific process order may be performed differently from the described order. For example, two consecutively described processes may be performed substantially at the same time or performed in an order opposite to the described order.

In the drawings, for example, illustrated shapes may be deformed according to fabrication technology and/or tolerances. Therefore, the example embodiments of the inventive concepts are not limited to certain shapes illustrated in the present specification, and may include modifications of shapes caused in fabrication processes.

Figure 15A:
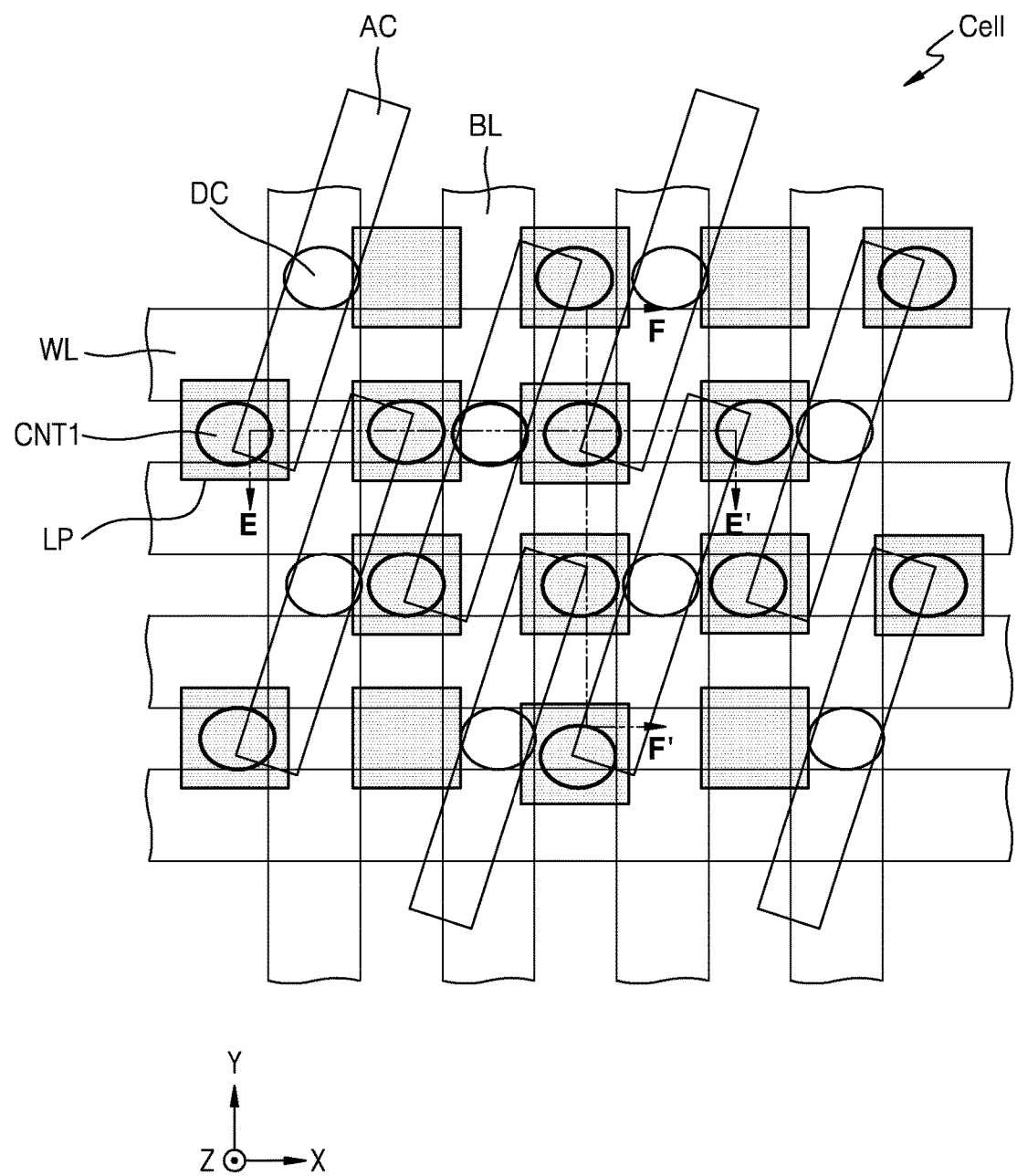
FIG. 15A is a diagram illustrating a plane layout of a cell region of FIG. 2.
Figure 15B:
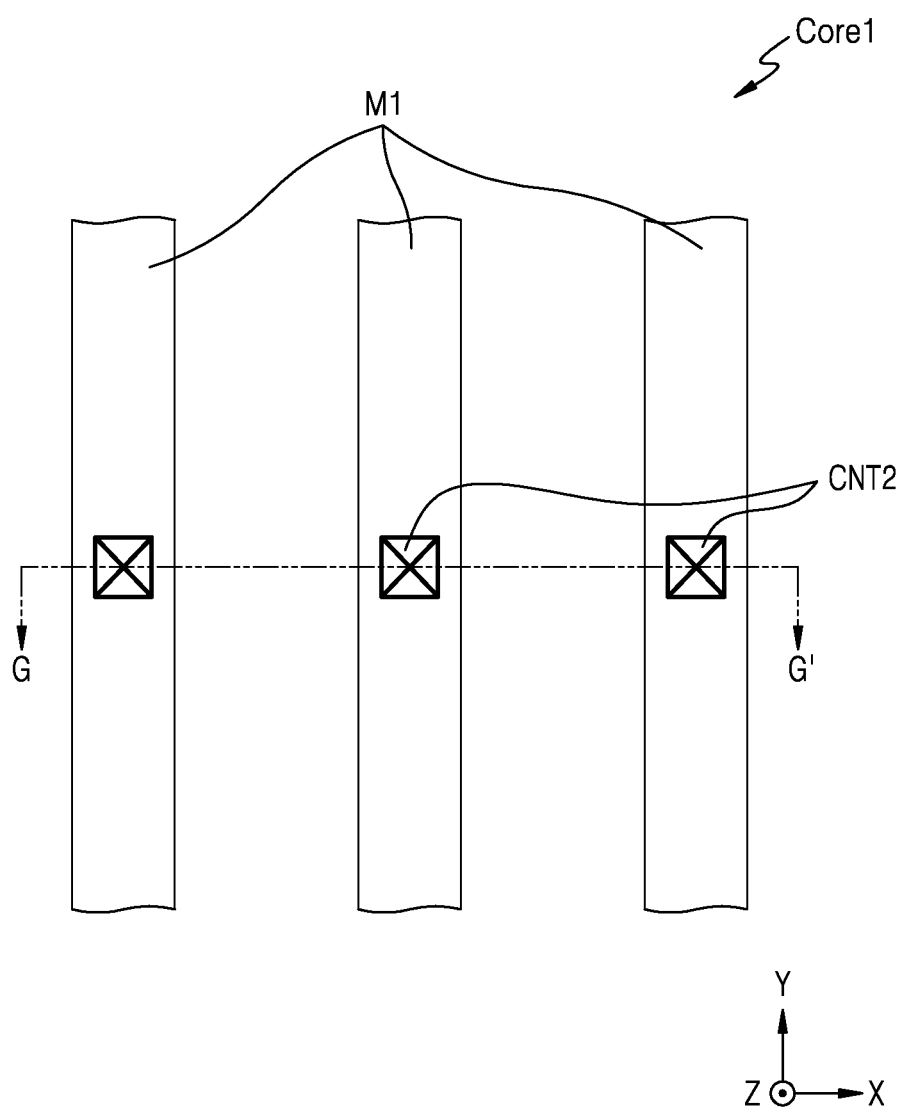
FIG. 15B is a diagram illustrating a plane layout of a first core region of FIG. 2.
Figure 15C:
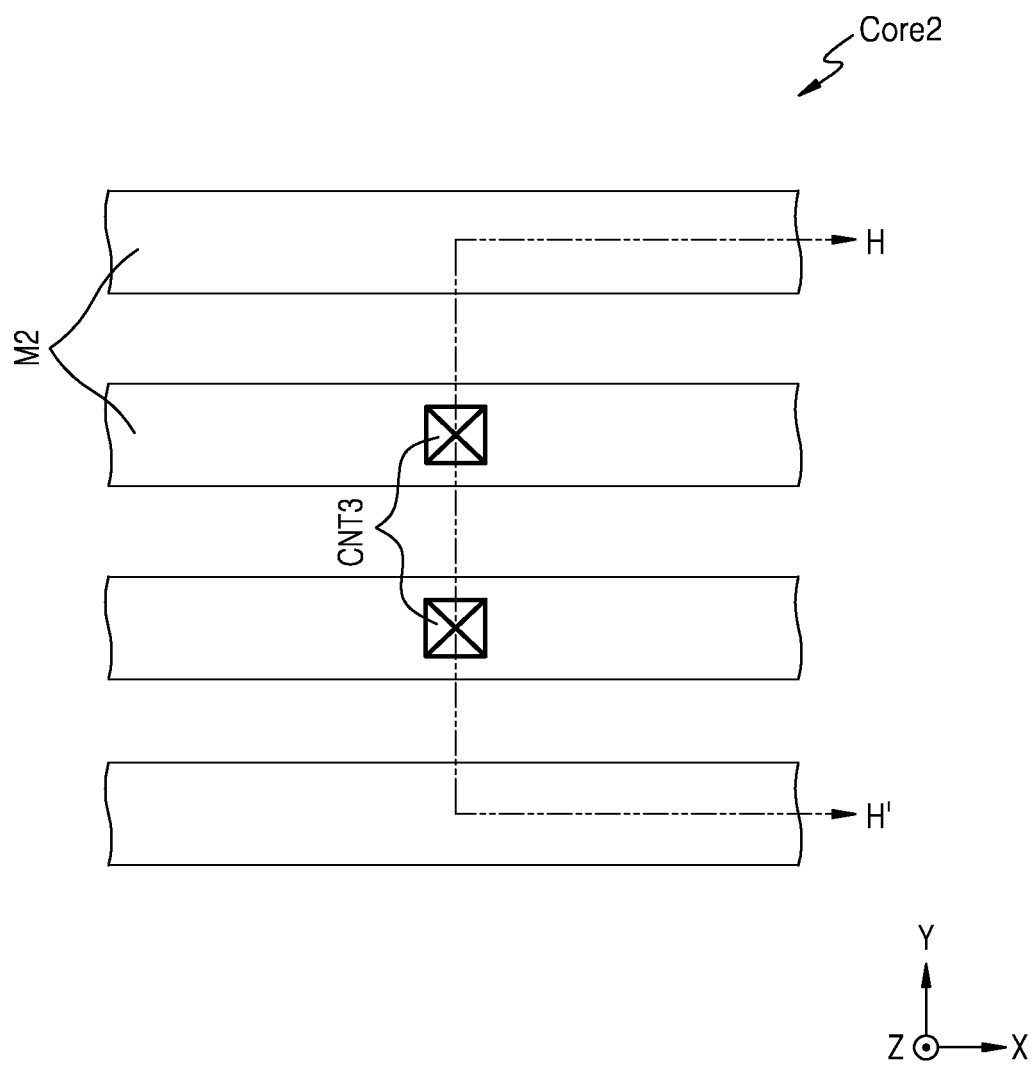
FIG. 15C is a diagram illustrating a plane layout of a second core region of FIG. 2.

FIGS. 15A, 15B, and 15C are diagrams illustrating plane layouts of a cell region Cell, a first core region Core1, and a second core region Core2 of a semiconductor device according to an example embodiment. The cell region Cell, the first core region Core1, and the second core region Core2 of FIGS. 15A, 15B, and 15C may respectively correspond to exemplified configurations of the cell region Cell, the first core region Core1, and the second core region Core2 of FIG. 2.

Referring to FIGS. 2 and 15A, the cell region Cell includes a plurality of active regions AC. Each of the plurality of active regions AC may have a relatively long island shape having a short axis and a long axis.

A plurality of word lines WL intersect the plurality of active regions AC and extend in parallel in a second direction (an X direction). The plurality of word lines WL may be spaced apart at regular intervals.

A plurality of bit lines BL extend on the plurality of word lines WL in parallel in a first direction (a Y direction) perpendicular to the second direction (the X direction). The plurality of bit lines BL are respectively connected to the plurality of active regions AC via a plurality of direct contacts DC.

A plurality of first contact plugs CNT1 may be formed on the active regions AC spaced apart from the direct contacts DC with the word lines WL therebetween. The plurality of first contact plugs CNT1 may be spaced apart in a line in the first direction (the Y direction) and the second direction (the X direction). The plurality of first contact plugs CNT1 may be spaced apart at regular intervals in the second direction (the X direction).

A plurality of landing pads LP may be spaced apart on the plurality of first contact plugs CNT1. Cross sections of the plurality of landing pads LP in the first and second directions (the Y and X directions) may be greater than those of the plurality of first contact plugs CNT1. The plurality of landing pads LP may increase a contact area between a capacitor and each of the plurality of first contact plugs CNT1.

Referring to FIGS. 2 and 15B, the first core region Core1 may be a region adjacent to the cell region Cell in the first direction (the Y direction), that is, a direction in which bit lines BL of the cell region Cell extend. Although not illustrated in drawings, the first core region Core1 may be a region in which a plurality of bit line sense amplifiers are arranged.

In the first core region Core1, first wiring lines M1 extend in parallel in the first direction (the Y direction). The first wiring lines M1 may be connected to second contact plugs CNT2 connected to active regions AC of a substrate or lower wiring lines.

Referring to FIGS. 2 and 15C, the second core region Core2 may be a region adjacent to the cell region Cell in the second direction (the X direction), that is, a direction in which the word lines WL of the cell region Cell extend. Although not illustrated in drawings, the second core region Core2 may be a region in which a plurality of sub-word line drivers are arranged.

In the second core region Core2, second wiring lines M2 extend in parallel in the second direction (the X direction). The second wiring lines M2 may be connected to third contact plugs CNT3 connected to active regions AC of the substrate or lower wiring lines.

Referring to FIG. 2, a third core region Core3 may be a region formed in a cross point between the first core region Core1 and the second core region Core2. The third core region Core3 may be a region in which power drivers and ground drivers for driving the sense amplifiers are alternately arranged.

FIGS. 16 to 20 are cross-sectional views for describing, according to a process sequence, a method of forming a pattern of the semiconductor device of FIGS. 15A to 15C. Cell_X, Cell_Y, Core1_X, and Core2_Y of FIGS. 16 to 20 are a cross-sectional view taken along line E-E' of the cell region Cell of FIG. 15A, a cross-sectional view taken along line F-F' of the cell region Cell of FIG. 15A, a cross-sectional view taken along line G-G' of the first core region Core1 of FIG. 15B, and a cross-sectional view taken along line H-H' of the second core region Core2 of FIG. 15C, respectively. Hereinafter, a method of contemporaneously forming the landing pad LP of the cell region Cell and the first and second wiring lines M1 and M2 of the first and second core regions Core1 and Core2 through two exposure processes will be described with reference to FIGS. 16 to 20.

Figure 16:
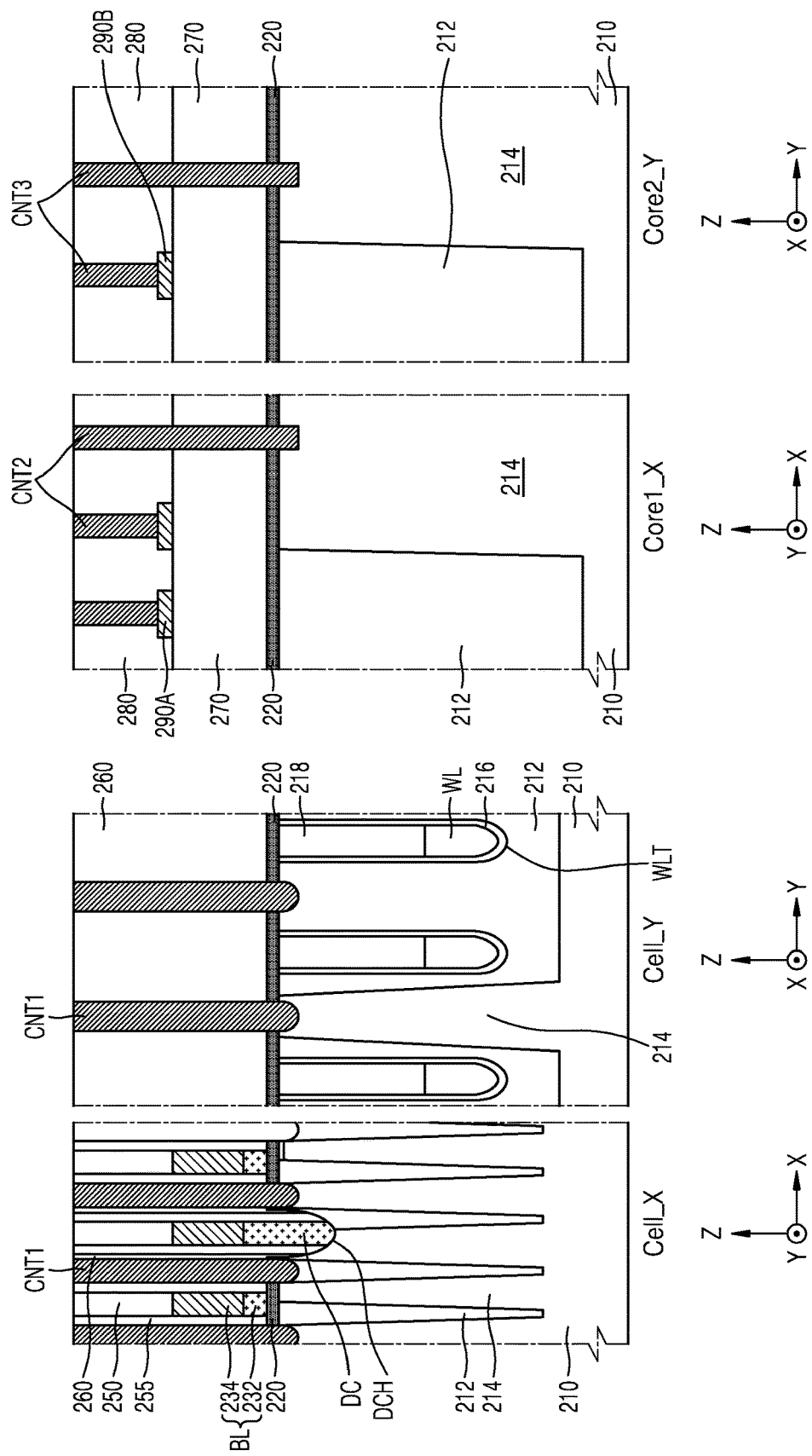
FIGS. 16 to 20 are cross-sectional views for describing, according to a process sequence, a method of forming a pattern of a semiconductor device of FIGS. 15A to 15C.

Referring to FIG. 16, a device isolation layer 212 is formed on a substrate 210, and thus, a plurality of active regions 214 are defined in a cell array region Cell and first and second core regions Core1 and Core2.

In the cell region Cell, a plurality of word line trenches WLT are formed in the substrate 210. The plurality of word line trenches WLT extend in parallel in a second direction (an X direction). A gate dielectric film 216, a word line WL, and a buried insulating film 218 are sequentially formed in the plurality of word line trenches WLT. After the word line WL is formed, source and drain regions may be formed by implanting impurity ions into the substrate 210 at both sides of the word line WL. In the cell region Cell and the first and second core regions Core1 and Core2, an insulating film 220 may be formed on the substrate 210.

In the cell region Cell and the first and second core regions Core1 and Core2, a first conductive layer 232 is formed on the substrate 210. In the cell region Cell, a direct contact hole DCH is formed by etching the first conductive layer 232, the substrate 210, and the device isolation film 212, and the direct contact hole DCH is filled with a second conductive layer and thus a direct contact DC is formed. In the cell region Cell, a third conductive layer 234 and a capping layer 250 may be sequentially formed on the first conductive layer 232 and the direct contact DC.

A first interlayer insulating film 270, which is flattened and covers the insulating film 220, may be formed in the first and second regions Core1 and Core2. Although not illustrated in drawings, the first interlayer insulating film 270 may include various devices.

In the cell region Cell, a mask pattern for forming a plurality of bit lines BL may be formed and the plurality of bit lines BL may be formed by etching the first conductive layer 232, the direct contact DC, the third conductive layer 234, and the capping layer 250. The mask pattern may be an etch mask for forming a wiring structure 290A in the first core region Core1 and a wiring structure 290B in the second core region Core2, and the wiring structures 290A and 290B may be contemporaneously formed by the etch process described above.

In the cell region Cell, an insulating spacer 255 may be formed on a side wall of each of the plurality of bit lines 260. A plurality of insulating patterns 260, which define a plurality of holes for forming a plurality of first contact plugs CNT1, are formed in spaces between the plurality of bit lines 260. The active regions 214 are exposed through the plurality of holes, and the plurality of holes are filled with a conductive layer and thus the plurality of first contact plugs CNT1 connected to the active regions 214 are formed.

In the first and second core regions Core1 and Core2, contact holes, which pass through the interlayer insulating film 270 and an interlayer insulating film 280, may be formed. Next, second contact plugs CNT2 and third contact plugs CNT3, which are connected to the wiring structures 290A and 290B or the active regions 214, may be formed by filling the contact holes with a conductive layer.

Figure 17:
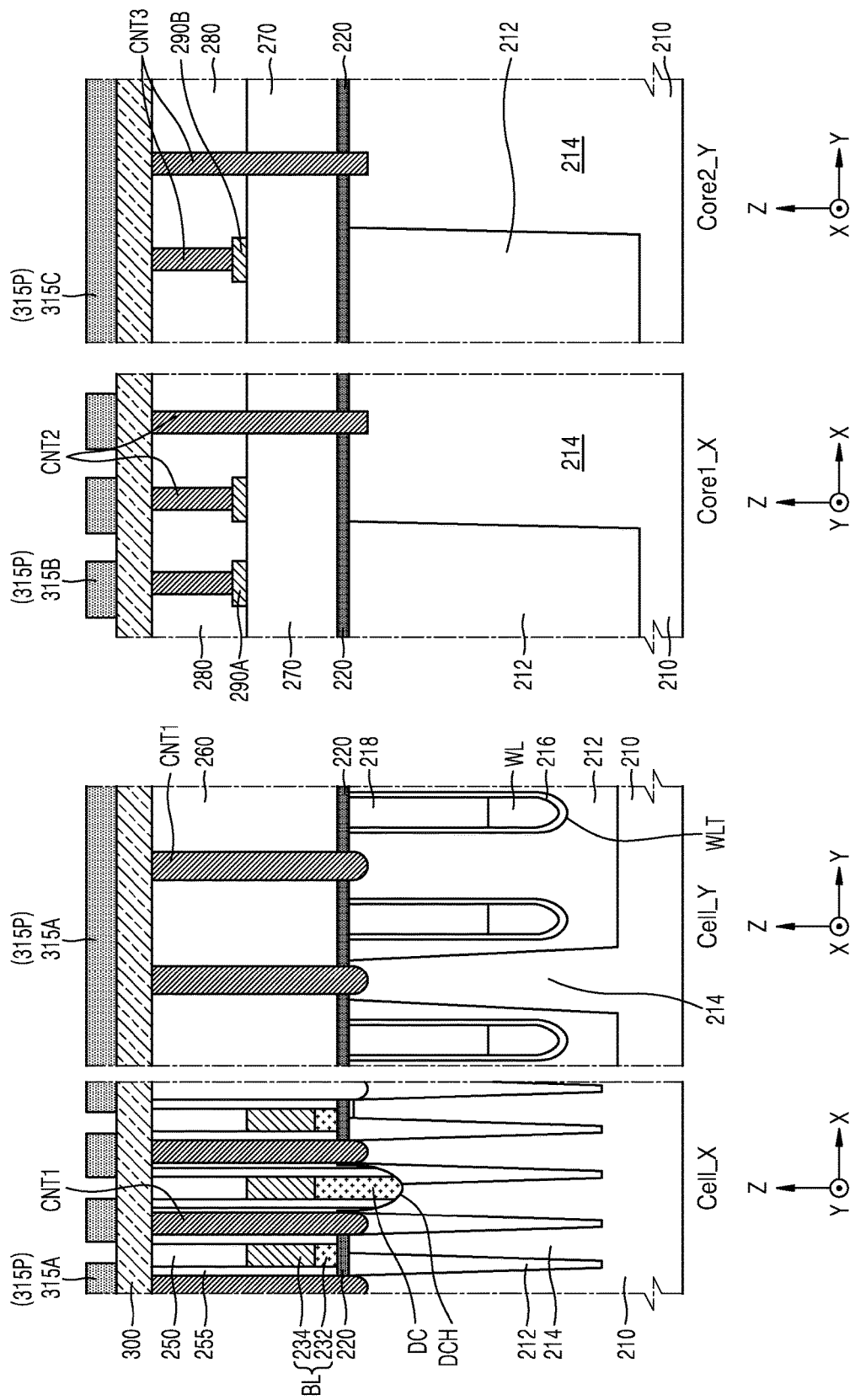

Referring to FIG. 17, an etch target film 300 and a first mask pattern 315P may be sequentially formed on the resultant structure of FIG. 16. The etch target film 300 may be formed on the entire surface of the resultant structure of FIG. 16, and thus may contact the top surface of the first to third contact plugs CNT1, CNT2, and CNT3. The etch target film 300 may be a conductive layer that is electrically connected to the first to third contact plugs CNT1, CNT2, and CNT3. For example, the first to third contact plugs CNT1, CNT2, and CNT3 may include tungsten or aluminum, but is not limited thereto.

The first mask pattern 315P may include a plurality of first mask lines 315A extending substantially in the first direction (the Y direction) in the cell region Cell, a plurality of second mask lines 315B extending substantially in the first direction (the Y direction) in the first core region Core1, and a mask film 315C covering the entire surface of the second core region Core2. The plurality of first mask lines 315A may be formed to overlap the plurality of first contact plugs CNT1 in a third direction (a Z direction). Similarly, the plurality of second mask lines 315B may be formed to overlap the plurality of second contact plugs CNT2 in the third direction (the Z direction). A process of forming the first mask pattern 315P is substantially the same as that of forming the mask pattern 115P of FIGS. 3 to 6B, described above.

Figure 18:
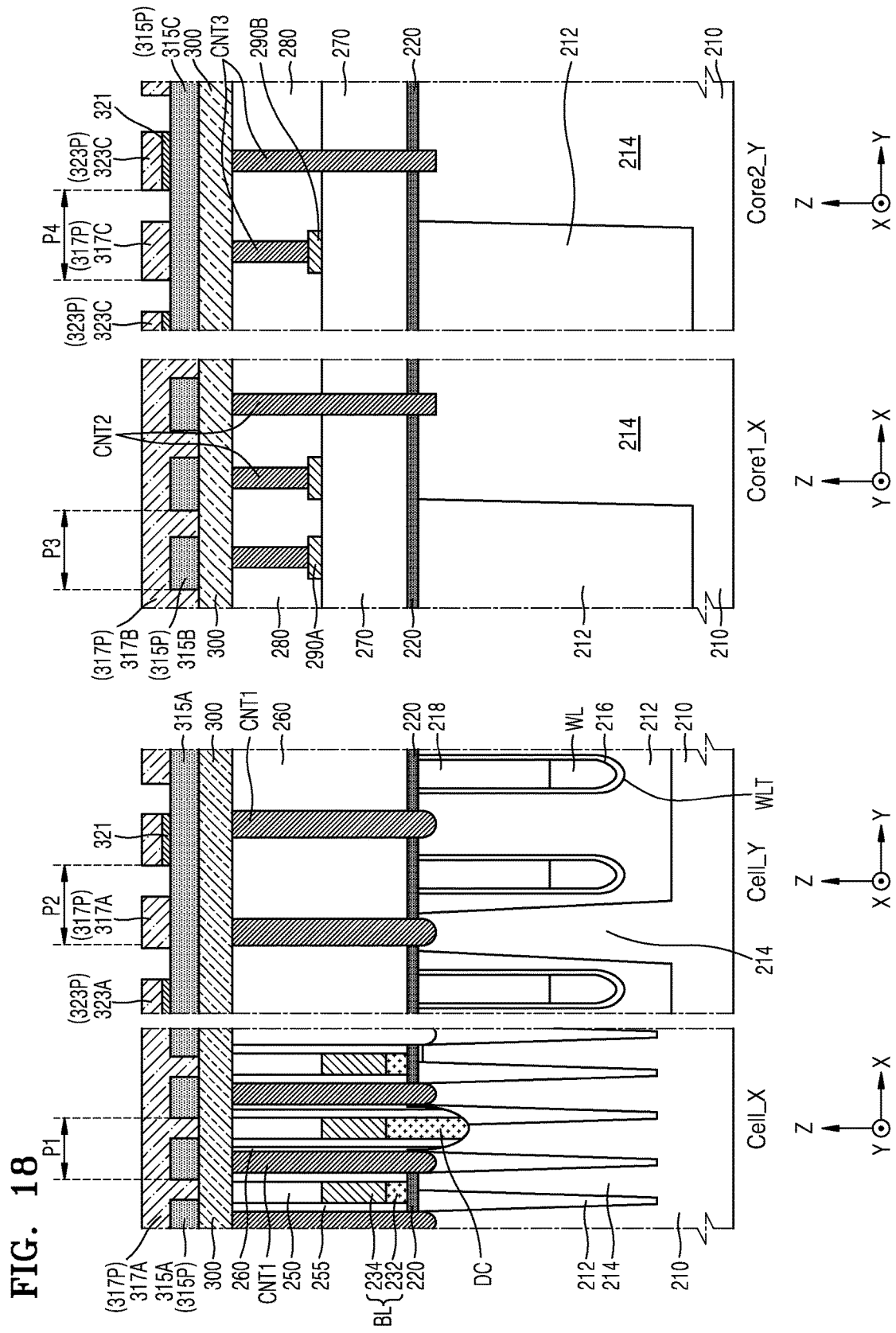

Referring to FIG. 18, a second mask pattern including a first preliminary mask pattern 317P and a second preliminary mask pattern 323P may be formed on the resultant structure of FIG. 17.

The second mask pattern may include a plurality of first preliminary mask lines 317A extending substantially in the second direction (the X direction) in the cell region Cell, a preliminary mask film 317B covering the entire surface of the first core region Core1, and a plurality of second preliminary mask lines 317C extending substantially in the second direction (the X direction) in the second core region Core2.

In the cell region Cell, third preliminary mask lines 323A may be formed, by a double patterning process, between first preliminary mask lines 317A adjacent to each other. In this case, the third preliminary mask lines 323A may be formed on a spacer layer 321. A mask pattern including the first and third preliminary mask lines 317A and 323A may have a target pitch P2.

In the second core region Core2, fourth preliminary mask lines 323C may be formed, by a double patterning process, between second preliminary mask lines 317C adjacent to each other. In this case, the fourth preliminary mask lines 323C may be formed on the spacer layer 321. A mask pattern including the second and fourth preliminary mask lines 317C and 323C may have a target pitch P4.

The plurality of first and third preliminary mask lines 317A and 323A may be formed to overlap the plurality of first contact plugs CNT1 in the third direction (the Z direction). Similarly, the plurality of second and fourth preliminary mask lines 317C and 323C may be formed to overlap the plurality of third contact plugs CNT3 in the third direction (the Z direction). A process of forming the second mask pattern including the first and second preliminary mask patterns 317P and 323P is substantially the same as that of forming the second mask pattern 115P including the third and fourth preliminary mask patterns 117P and 123P of FIGS. 7 to 10B.

Figure 19:
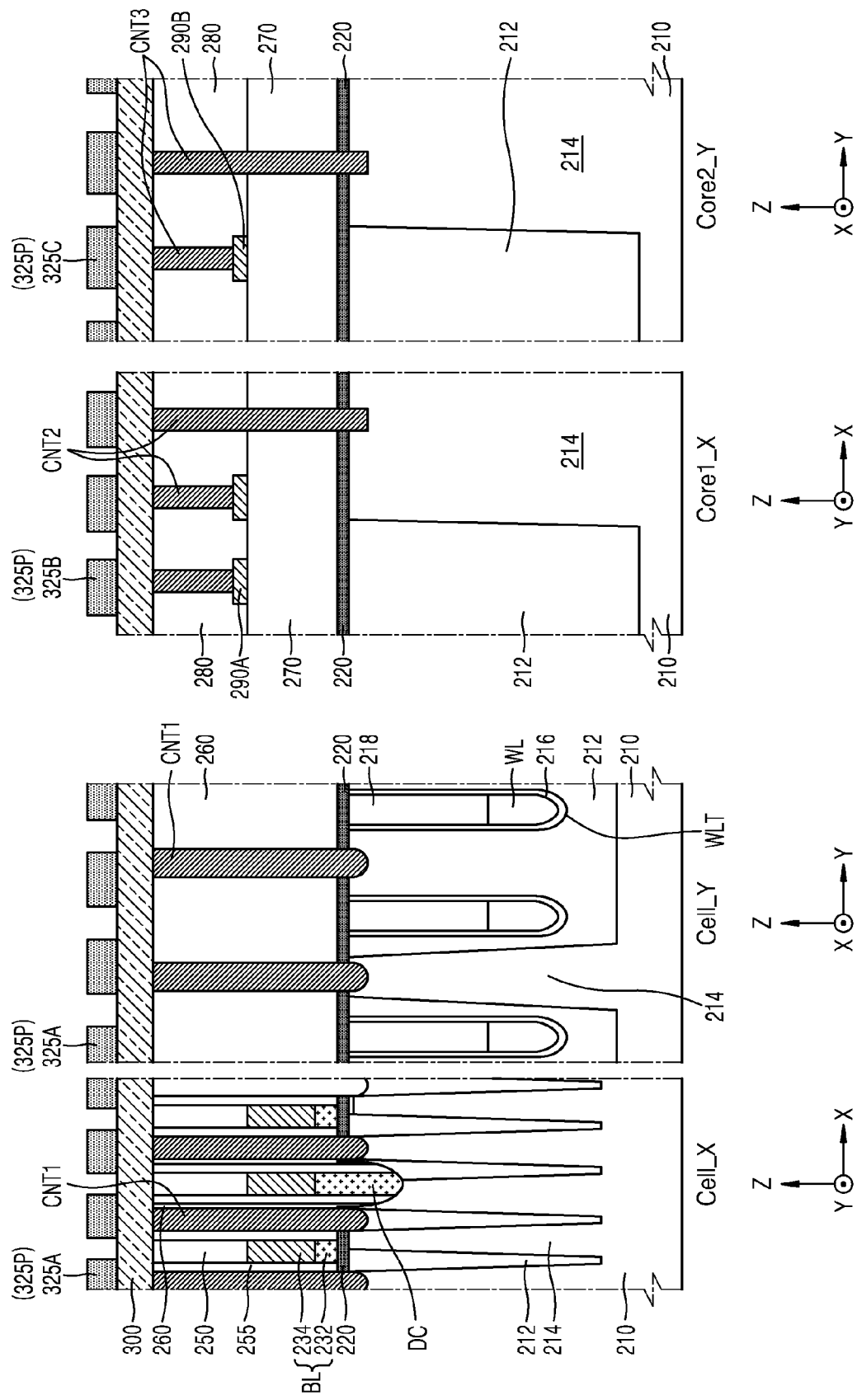

Referring to FIG. 19, a third mask pattern 325P may be formed by etching the first mask pattern 315P of FIG. 18 by using the second mask pattern, which includes the first and second preliminary mask patterns 317P and 323P of FIG. 18, as an etch mask.

The third mask pattern 325P may include a plurality of island-type masks 325A spaced apart in a matrix in the cell region Cell, a plurality of third mask lines 325B extending substantially in the first direction (the Y direction) in the first core region Core1, and a plurality of fourth mask lines 325C extending substantially in the second direction (the X direction) in the second core region Core2. A process of forming the third mask pattern 325P is substantially the same as that of forming the third mask pattern 125P of FIGS. 11A and 11B.

Figure 20:
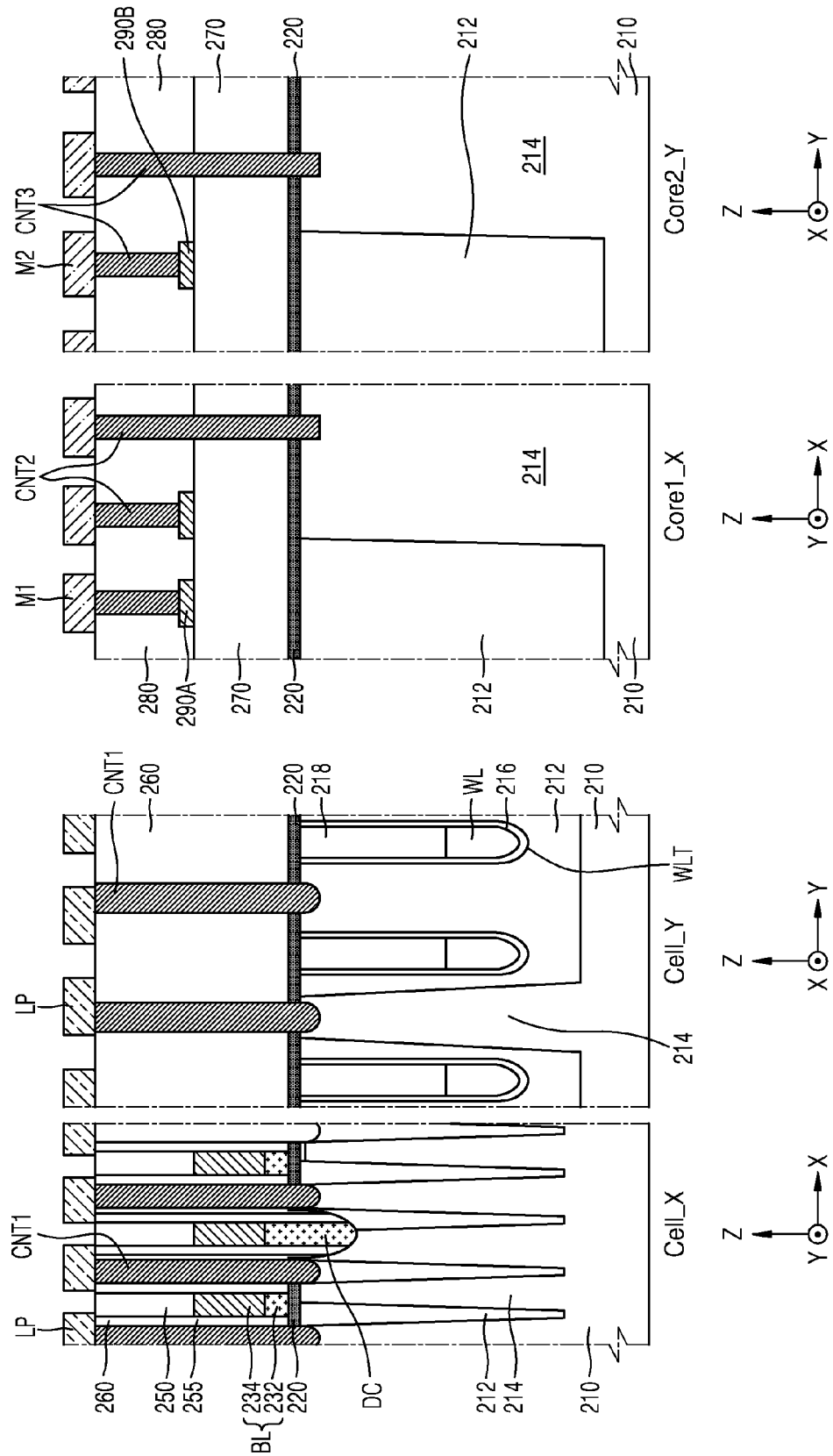

Referring to FIG. 20, the etch target film 300 may be etched by using the third mask pattern 325P of FIG. 19 as an etch mask. Accordingly, a plurality of island-type landing pads LP may be formed in the cell region Cell, a plurality of line-type first wiring lines M1 extending substantially in the first direction (the Y direction) may be formed in the first core region Core1, and a plurality of line-type second wiring lines M2 extending substantially in the second direction (the X direction) may be formed in the second core region Core2.

The plurality of island-type landing pads LP may be connected to the first contact plugs CNT1, the plurality of line-type first wiring lines M1 may be connected to the second contact plugs CNT2, and the plurality of line-type second wiring lines M2 may be connected to the third contact plugs CNT3. Capacitors may be formed on the plurality of island-type landing pads.

The device and wiring structure for the cell region Cell and the first and second core regions Core1 and Core2, described with reference to FIGS. 16 to 20, is only an example, and the inventive concepts are not limited thereto. The method of forming a pattern of a semiconductor device, according to the present example embodiment, may be applied based on various device and wiring structures.

The method of forming a pattern of a semiconductor device, according to the present example embodiment, may include an operation in which the first and second wiring lines M1 and M2, which are formed in the first and second core regions Core1 and Core2, are separated based on a dominant direction, such as the first and second directions (the Y and X directions), and are formed through a plurality of exposure processes that are used in the patterning of the cell region Cell. In other words, a risk due to an alignment error of the first and second wiring lines M1 and M2 that are formed in the first and second core regions Core1 and Core2 may be reduced by separately forming the first and second wiring patterns M1 and M2 based on a dominant direction. In addition, as each of exposure processes for forming fine wiring lines M1 and M2 of the core regions Core1 and Core2 is performed contemporaneously with a plurality of exposure processes that are performed to form fine landing pads LP of the cell region Cell, the number of exposure processes may be reduced and thus a process cost may be reduced.

While the inventive concepts have been particularly shown and described with reference to example embodiments thereof, it will be understood that various changes in form and details may be made therein without departing from the spirit and scope of the following claims.

What is claimed is:

1. A method of forming a pattern of a semiconductor device, the method comprising:
    forming a first mask pattern including a plurality of first mask lines extending in a first direction in a cell region of a substrate and a plurality of second mask lines extending in the first direction in a first core region of the substrate, the first mask pattern covering a second core region of the substrate;
    forming, on the first mask pattern, a second mask pattern including a plurality of third mask lines extending in a second direction in the cell region and a plurality of fourth mask lines extending in the second direction in the second core region, the second mask pattern covering the first core region; and
    forming a third mask pattern by etching the first mask pattern using the second mask pattern as an etch mask, the third mask pattern including a plurality of island-type masks in the cell region, a plurality of fifth mask lines extending in the first direction in the first core region, and a plurality of sixth mask lines extending in the second direction in the second core region.

2. The method of claim 1, further comprising:
    after forming the third mask pattern, etching an etch target film, by using the third mask pattern as an etch mask pattern,
    wherein the etching contemporaneously forms a plurality of island-type first patterns in the cell region, a plurality of line-type second patterns in the first core region, and a plurality of line-type third patterns in the second core region.

3. The method of claim 2, further comprising:
    forming a plurality of contact plugs, which are electrically connected to an active region of the substrate, in the cell region and each of the first and second core regions,
    wherein the plurality of island-type first patterns includes landing pads connected to the contact plugs of the cell region,
    the plurality of line-type second patterns includes first wiring lines connected to the contact plugs of the first core region,
    and the plurality of line-type third patterns includes second wiring lines connected to the contact plugs of the second core region.

4. The method of claim 1, wherein
    the cell region includes a plurality of word lines extending in the second direction and a plurality of bit lines extending over the substrate and in the first direction, and
    the first core region comprises a sense amplifier region adjacent to the cell region in the first direction, and the second core region comprises a sub-word line driver region adjacent to the cell region in the second direction.

5. The method of claim 1, wherein
    the forming a first mask pattern includes,
        performing a first exposure process and a first double patterning process to form a first photoresist pattern, and
    the forming a second mask pattern includes,
        performing a second exposure process and a second double patterning process to form a second photoresist pattern.

6. The method of claim 5, wherein
a pitch of a first photoresist pattern in the first core region is twice a pitch of the first mask pattern in the first core region, and
a pitch of a second photoresist pattern in the second core region is twice a pitch of the second mask pattern in the second core region.

7. The method of claim 5, wherein there is no exposure process between the performing a second double patterning process and the forming a third mask pattern.

8. The method of claim 1, wherein the first direction and the second direction are perpendicular to one another.

9. The method of claim 1, wherein widths of the plurality of second and fourth mask lines are greater than widths of the plurality of first and third mask lines, respectively.

10. The method of claim 1, wherein the second and fourth mask lines have varying widths.

11. The method of claim 1, further comprising:
trimming a portion of the third mask pattern after the formation of the third mask pattern.

12. A method of forming a pattern of a semiconductor device, the method comprising:
forming a first mask pattern including a plurality of first mask lines extending in a first direction in a cell region and a core region of a substrate;
forming a second mask pattern on the first mask pattern, the second mask pattern including a plurality of second mask lines extending in a second direction in the cell region and a plurality of third mask lines extending in the second direction in the core region, wherein the plurality of second mask lines intersect the plurality of first mask lines; and
forming a third mask pattern by etching the first mask pattern using the second mask pattern as an etch mask, the third mask pattern including a plurality of island-type first patterns in the cell region, a plurality of fourth mask lines extending in the first direction in the core region, and a plurality of fifth mask lines extending in the second direction in the core region.

13. The method of claim 12, wherein the forming a first mask pattern comprises:
performing a first exposure process and a first double patterning process to form a first photoresist pattern, and the formation of the second mask pattern includes;
performing a second exposure process and a second double patterning process to form a second photoresist pattern.

14. The method of claim 13, wherein there is no exposure process between a performing a second double patterning process and a forming a third mask pattern.

15. The method of claim 13, further comprising:
after the formation of the third mask pattern, etching an etch target film by using the third mask pattern as an etch mask pattern,
wherein the etching contemporaneously forms a plurality of island-type first patterns in the cell region, a plurality of line-type second patterns extending substantially in the first direction in the core region, and a plurality of line-type third patterns extending substantially in the second direction in the core region.

16. A method of forming a pattern comprising:
forming a first mask pattern, the first mask pattern including a first plurality of lines extending in a first direction in a first region of a semiconductor device, a second plurality of lines extending in the first direction in a second region of the semiconductor device, and a third plurality of lines extending in the first direction in a third region of the semiconductor device; and
forming a second mask pattern on the first mask pattern, the second mask pattern including a fourth plurality of lines extending in a second direction in the first region of the semiconductor device, a fifth plurality of lines extending in the second direction in a fourth region of the semiconductor device, and a sixth plurality of lines extending substantially in the second direction in the third region of the semiconductor device; and
forming a third mask pattern by etching the first mask pattern using the second mask pattern as an etch mask.

17. The method of claim 16, wherein
the first region includes memory cells of the semiconductor device, and
the third region includes power drivers and ground drivers of the semiconductor device.

18. The method of claim 16, wherein the first region is larger than the third region.

19. The method of claim 16, further comprising:
trimming a portion of the third mask pattern; wherein
the forming a first mask pattern includes forming a first photoresist pattern using a first immersion photolithography process;
the forming a second mask pattern includes forming a second photoresist pattern using a second immersion photolithography process; and
the trimming includes forming a trimming pattern using a dry photolithography process.

20. The method of claim 16, further comprising:
trimming a portion of the third mask pattern after the formation of the third mask pattern, wherein
the forming of a first mask pattern includes forming a first photoresist pattern using a first photolithography process, the first photolithography process using light of a first wavelength to expose a first photoresist;
the forming of a second mask pattern includes forming a second photoresist pattern using a second photolithography process, the second photolithography process using light of the first wavelength to expose a second photoresist; and
the trimming includes forming a trimming photoresist pattern using a trimming photolithography process, the trimming photolithography process using light of a trimming wavelength to expose a trimming photoresist, and the trimming wavelength is larger than the first wavelength.

* * * * *